US006981832B2

(12) United States Patent
Zinger et al.

(10) Patent No.: US 6,981,832 B2
(45) Date of Patent: Jan. 3, 2006

(54) WAFER HANDLING SYSTEM

(75) Inventors: Jan Zinger, Dwingeloo (NL);
Christianus G. M. De Ridder, Hoogland (NL)

(73) Assignee: ASM International NV, Bilthoven (NL)

( * ) Notice: Subject to any disclaimer, the term of this patent is extended or adjusted under 35 U.S.C. 154(b) by 202 days.

(21) Appl. No.: 10/641,807

(22) Filed: Aug. 15, 2003

(65) Prior Publication Data

US 2004/0037675 A1 Feb. 26, 2004

Related U.S. Application Data

(62) Division of application No. 09/769,088, filed on Jan. 24, 2001, now Pat. No. 6,632,068.
(60) Provisional application No. 60/236,046, filed on Sep. 27, 2000.

(51) Int. Cl.
*H01L 21/00* (2006.01)

(52) U.S. Cl. ........................................ 414/217; 414/292
(58) Field of Classification Search ................. 414/217, 414/275, 416, 68, 292, 935, 940, 94
See application file for complete search history.

(56) References Cited

U.S. PATENT DOCUMENTS

| 5,059,079 | A | * | 10/1991 | Foulke et al. ................ 414/275 |
| 5,186,594 | A | | 2/1993 | Toshima et al. |
| 5,407,449 | A | | 4/1995 | Zinger |
| 5,556,147 | A | | 9/1996 | Somekh et al. |
| 5,570,987 | A | * | 11/1996 | McKenna ............... 414/416.01 |
| 5,628,604 | A | | 5/1997 | Murata et al. |
| 5,653,565 | A | | 8/1997 | Bonora et al. |
| 5,713,711 | A | | 2/1998 | McKenna et al. |
| 5,752,796 | A | | 5/1998 | Muka |
| 5,879,277 | A | | 3/1999 | Dettman et al. |
| 5,915,562 | A | | 6/1999 | Nyseth et al. |
| 5,980,183 | A | | 11/1999 | Fosnight |
| 6,010,008 | A | * | 1/2000 | Nyseth et al. ............... 206/711 |
| 6,060,992 | A | * | 5/2000 | Huang et al. ................ 340/674 |
| 6,079,927 | A | | 6/2000 | Muka |
| 6,095,335 | A | | 8/2000 | Busby |
| 6,142,722 | A | * | 11/2000 | Genov, deceased et al. 414/217 |
| 6,208,908 | B1 | * | 3/2001 | Boyd et al. .................. 700/216 |
| 6,238,283 | B1 | | 5/2001 | Matsuyama et al. |
| 6,283,692 | B1 | | 9/2001 | Perlov et al. |
| 6,398,032 | B2 | * | 6/2002 | Fosnight et al. ............ 206/711 |
| 6,481,945 | B1 | | 11/2002 | Hasper et al. |

FOREIGN PATENT DOCUMENTS

| JP | 2002-231802 | | 8/2002 |
| WO | WO 99/38199 | * | 7/1999 |
| WO | WO 99/65064 | | 12/1999 |

OTHER PUBLICATIONS

SEMI E62–0997 "Provisional Specification for 300–mm Front–Opening Interface Mechanical Standard (FIMS)" [FOUP Standard] (1997).

* cited by examiner

*Primary Examiner*—Eileen D. Lillis
*Assistant Examiner*—Charles A. Fox
(74) *Attorney, Agent, or Firm*—Knobbe Martens Olson and Bear LLP

(57) ABSTRACT

A system for processing semiconductor wafers includes adaptations allowing the selective handling of cassettes for both 200-mm wafers and 300-mm wafers. The system is configured initially for handling standard 300-mm FOUP cassettes. Adaptions for handling 200-mm wafer open cassettes include a load port adapter frame for receiving such cassettes on a input/output platform; a cassette handler adapter configured for reversibly mounting on a cassette handler end effector and for receiving 200-mm open cassettes; a store adapter frame for converting 300-mm FOUP storage compartments into compartments for storing 200-mm open cassettes; and a Transhipment FOUP for holding 200-mm open cassettes upon a cassette transfer platform and bringing such cassettes into an interface with a wafer handler. The Transhipment FOUP has outer surfaces resembling a standard 300-mm FOUP cassette, but is configured to receive a 200-mm open cassette therein.

21 Claims, 17 Drawing Sheets

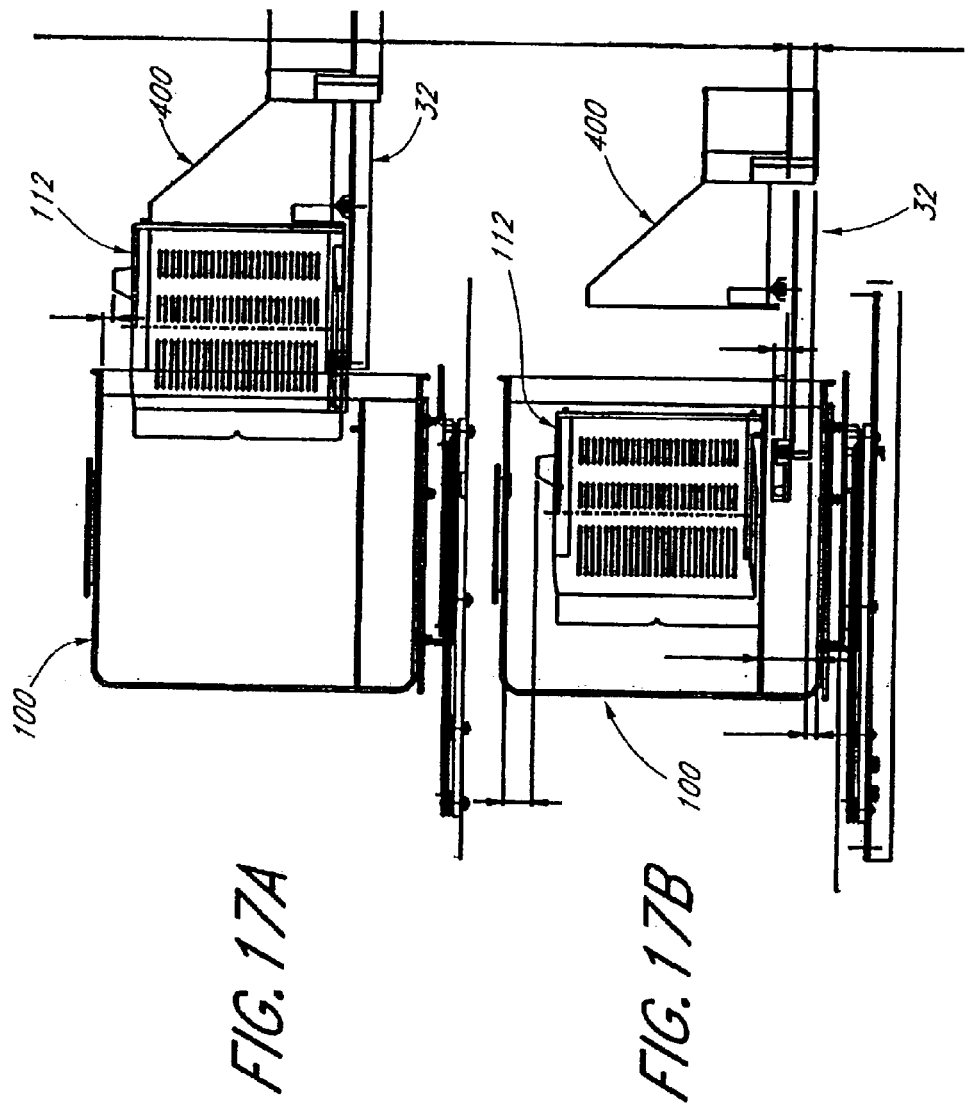

WAFER HANDLING SYSTEM

REFERENCE TO RELATED APPLICATION

This application is a divisional of application Ser. No. 09/769,088, filed Jan. 24, 2001 (now U.S. Pat. No. 6,632, 068, issued Oct. 14, 2003), which claims the benefit under 35 U.S.C. §119(e) of provisional Application No. 60/236, 046, filed Sep. 27, 2000.

FIELD OF THE INVENTION

The invention relates to processing tools utilized for semiconductor wafer processing and more particularly to wafer processing tools that are configured for 300-mm wafer processing in which the wafers are supplied in FOUP cassettes.

BACKGROUND OF THE INVENTION

When processing semiconductor wafers in processing tools, the processing tool is adapted to and optimized for the size of the wafer to be processed. The size of the wafers are standardized in a limited number of discrete sizes where there has been a tendency towards increasing size in the past decades in order to increase the production efficiency. The three most recently introduced wafer sizes are 150 mm, 200-mm and 300-mm diameter.

A given wafer fabrication facility will normally be configured for handling one wafer size. However, in R&D, pilot production or implementation of a new technology in production, there is a need for tools that can process multiple wafer sizes alternatingly or that can easily be reconfigured for handling different wafer sizes. In the past, when using open cassettes that hold the wafers, this was not a major issue. A wafer handling device can easily be configured so that it can handle wafers of different sizes from/to their respective open cassettes. However, the use of the closed FOUP cassettes for 300-mm wafers requires specific features in the wafer handling and cassette handling system that do not allow handling 200-mm open cassettes alternatingly in the same system.

Accordingly, a need exists for a system capable of handling multiple sizes of substrates in a state-of-the-art facility.

SUMMARY OF THE INVENTION

According to the invention a system, layed out for handling 300-mm wafers, supplied in 300-mm FOUP cassettes, is provided with a tool set to accommodate 200-mm cassettes during wafer transfer and cassette transfer. This tool set comprises a "Transhipment FOUP" cassette designed to receive a 200-mm open cassette in its interior. The term "Transhipment FOUP" is used herein as a label to distinguish 200-mm open cassettes and standard 300-mm FOUP cassettes. When 200-mm wafers need to be handled, the cassette handler places the 200-mm cassette in the Transhipment FOUP and, subsequently, the Transhipment FOUP, containing the 200-mm cassette, is brought into active connection with a wafer handling device. According to a further aspect of the invention, this tool set comprises a cassette handler adapter that allows the 300-mm FOUP cassette handler to handle 200-mm cassettes. The system is programmed such that the tools are automatically picked up from their storage position when needed.

BRIEF DESCRIPTION OF THE DRAWINGS

FIGS. 17A and 17B are right side elevational views showing the operation of loading an open cassette into the Transhipment FOUP of the preferred embodiments.

DETAILED DESCRIPTION OF THE PREFERRED EMBODIMENT

Figure 1:
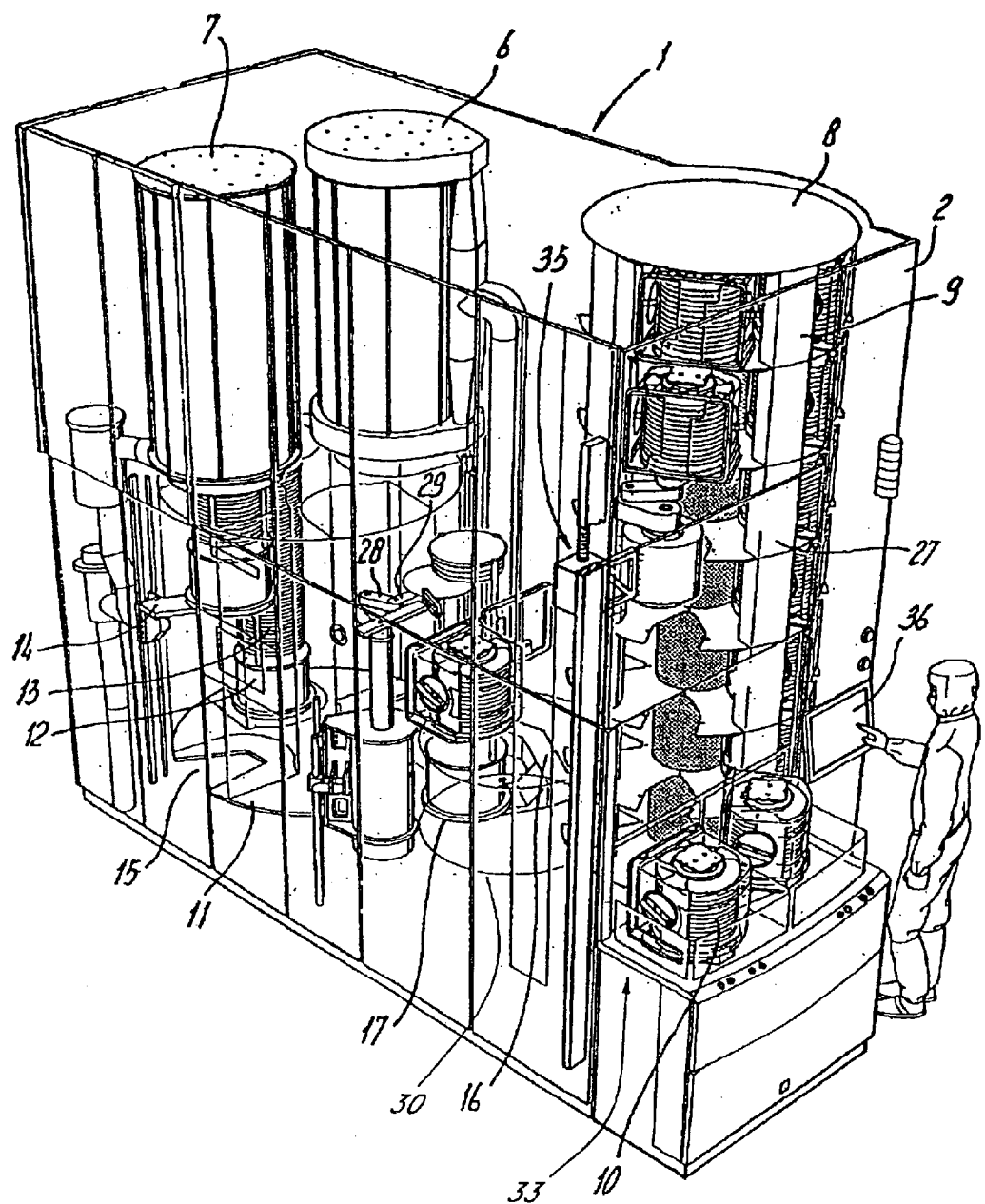
FIG. 1 is a perspective view of a 300-mm wafer processing system, constructed in accordance with the prior art.
Figure 2:
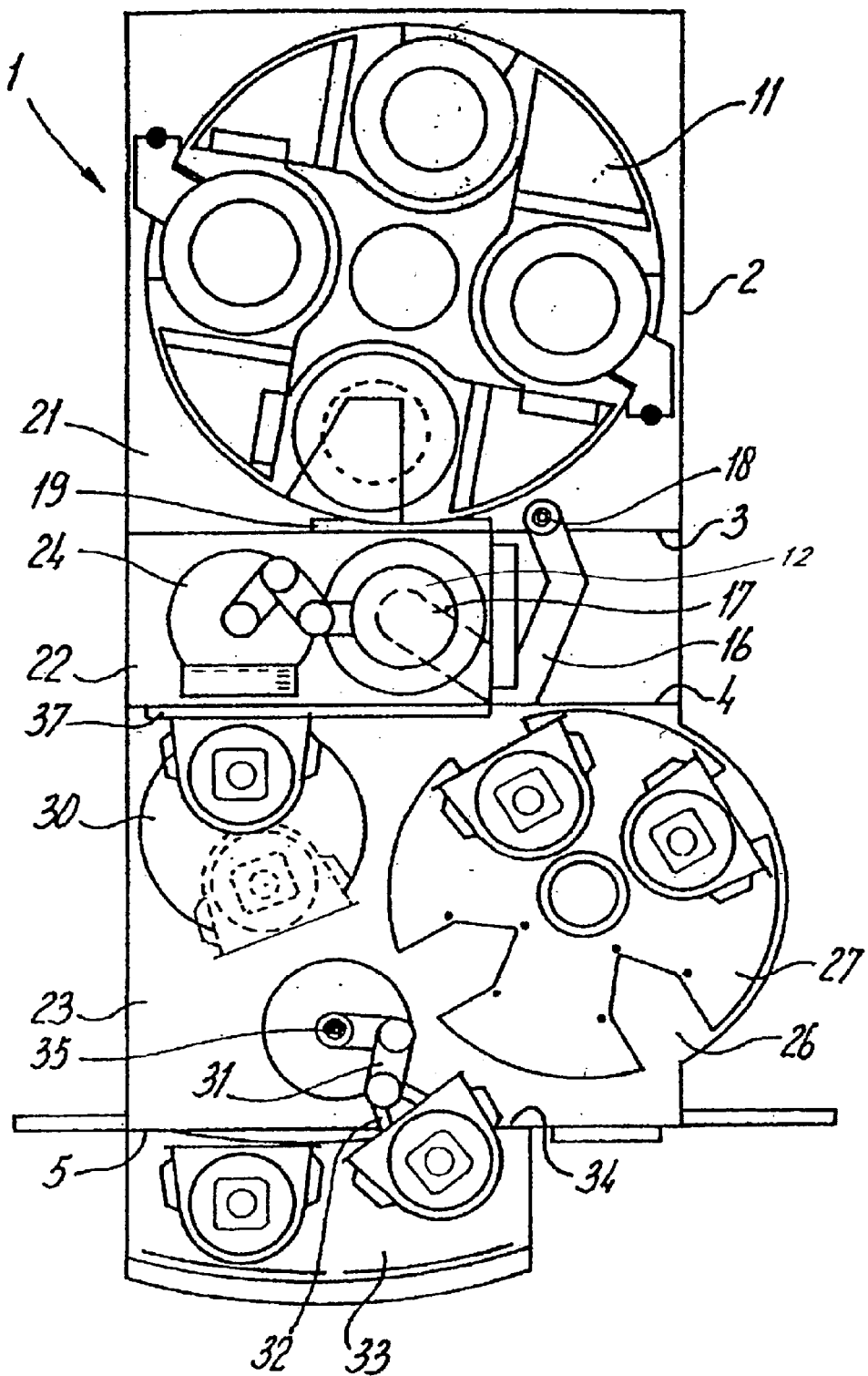
FIG. 2 is a schematic plan view of the system of according to FIG. 1.

Initially, with reference to FIGS. 1 and 2, a wafer processing system according to the prior art is described. The subsequent figures and corresponding text below illustrate how the preferred embodiment is adapted to this particular wafer processing system. The skilled artisan will readily appreciate, however, that the principles and advantages of the cassettes described herein can be readily adapted to other processing systems where handling of cassettes and wafers therefrom is at least partially automated.

FIG. 1 shows, diagrammatically and partially exposed, a perspective view and FIG. 2 shows a plan view of a wafer processing system for 300-mm wafers supplied 300-mm FOUP cassettes, according to the prior art. The wafer processing system is indicated in its entirety by reference numeral 1. This system 1 comprises a housing 2 and is generally installed in a so-called "clean room." In addition to the housing 2, partitions 3, 4 and 5 are also present. The housing 2 delimits, with the partition 3, a processing area or chamber 21. In this example, the processing area 21 comprises vertical furnaces 6, 7. The housing 2 and the partitions 3 and 4 define a wafer handling chamber 22. A cassette transfer chamber 23 is defined between the housing 2 and partitions 4 and 5. The input/output station, to transfer cassettes into and out of the system 1, is indicated by reference numeral 33.

Wafers 13 are supplied in cassettes 10, which are placed on the input/output station 33. A cassette handling device 31 transfers the cassettes 10 from the input/output station 33 through a closable opening 34 into a cassette store 8 located in the cassette transfer chamber 23. The cassette store 8 is provided with a number of rotary platforms 27 above one another, on which the cassettes 10 are stored. The cassette handling device 31 is movable in vertical direction by means of an elevator 35 so that the different platforms 27 can be reached. The cassette handling device 31 is provided with a cassette end effector 32, which has dimensions a little smaller than those of a series cut-outs 26 in the rotary platforms 27. When the cassette handling device 31 has transferred a cassette into the store 8, the end effector 32 can be lowered through one of the cut-outs 26 in one of the platforms 27 to place the cassette on the platform 27. Subsequently, the cassette handler 31 can be retracted from cassette store 8. The cassette handling device 31 is mounted such that it is able to transfer cassettes between the input/output station 33 and store 8. The device 31 is also capable of transferring cassettes between the store 8 and a rotatable cassette transfer platform 30, or between the input/output station 33 and the rotatable cassette transfer platform 30.

The rotatable cassette transfer platform 30 is constructed such that, on rotation, the cassette is placed against the partition 4 between the cassette transfer chamber 23 and the wafer handling chamber 22. The partition 4 is provided with a closure and a closure mechanism, together forming an interface schematically indicated by reference numeral 37. The interface 37 is configured for 300-mm FOUP cassettes. After placing the cassette against the interface 37 in the partition 4, the closure mechanism grips and unlocks the closure of the FOUP cassette and simultaneously opens the closure in the partition 4 and the closure of the FOUP cassette.

A wafer handling device 24 within the wafer handling chamber 22 transfers wafers between the cassette concerned and a wafer boat 12. After completion of the loading of wafers into the wafer boat 12, a boat transfer arm 16 moves the wafer boat 12 through a closable opening in partition 3 from the wafer handling chamber 22 into the processing chamber 21. The processing chamber 21 is provided with a rotary boat transfer platform 11, supporting the wafer boat 12. Two reactors, which in this case comprise furnaces 6, 7, are arranged in processing chamber 21. The furnaces 6, 7 are positioned vertically and wafer boats, indicated by 12, filled with wafers 13, are introduced into the furnaces 6, 7 in the vertical direction from below. To this end, each furnace 6, 7 has an insertion arm 14, which is movable in the vertical direction. Only one insertion arm 14 can be seen in FIG. 1.

The treatment of a large number of wafers can be carried out as follows: The operator, shown diagrammatically in FIG. 1, loads the store 8 by introducing a number of cassettes 10 on the input/output station 33 and carrying out control operations on a control panel 36. Each of the cassettes 10 is transferred from the input/output station 33 with the aid of the cassette handling device 31 into the storage compartments 9 made for these cassettes in the store 8, specifically on the stacked rotary platforms 27. By rotation of the store 8 and use of the elevator 35, it is possible to fill various compartments with the cassettes 10. After filling the store 8, no further human interaction is required with this automated installation.

The cassettes 10 concerned are then removed from the store 8 by the cassette handler device 31 and placed on the cassette transfer platform 30. The cassette transfer platform 30 comprises two levels, schematically indicated in FIG. 1, each level capable of receiving a FOUP cassette, where the two levels can be rotated independently of one another. Upon rotation of the cassette transfer platform 30, the cassettes are placed against partition 4. After opening of the closure of the FOUP cassette, together with the closure 37 in partition 4, the wafers are removed by the wafer handler 24 and placed in a wafer boat 12. After the wafer boat 12 has been filled, and becomes available for one of the reactors 6, 7, the closure 19 in partition 3 is opened and the wafer boat 12 is placed on the rotary boat transfer platform 11 by the boat transfer arm 16. The boat transfer platform 11 then moves the wafer boat 12 within the process chamber 21 to a position below the reactor to be loaded. Then the insertion mechanism or elevator 14 moves the boat into the reactor 6 or 7. Treated wafers execute a movement counter to the above.

This system is described in further detail in published PCT application WO 99/38199 of applicant, the disclosure of which is incorporated herein by reference. Although an operator is described as introducing the cassette on the input/output station 33, the system is designed such that the cassettes can alternatively be introduced on the input/output station by means of an automatic guided vehicle (AGV) or by an overhead hoist system. In such a case, the control system of the wafer processing system can be connected to a host computer system that carries out the control functions. In this way, no human interaction at the wafer processing system is required at all.

Figure 3:
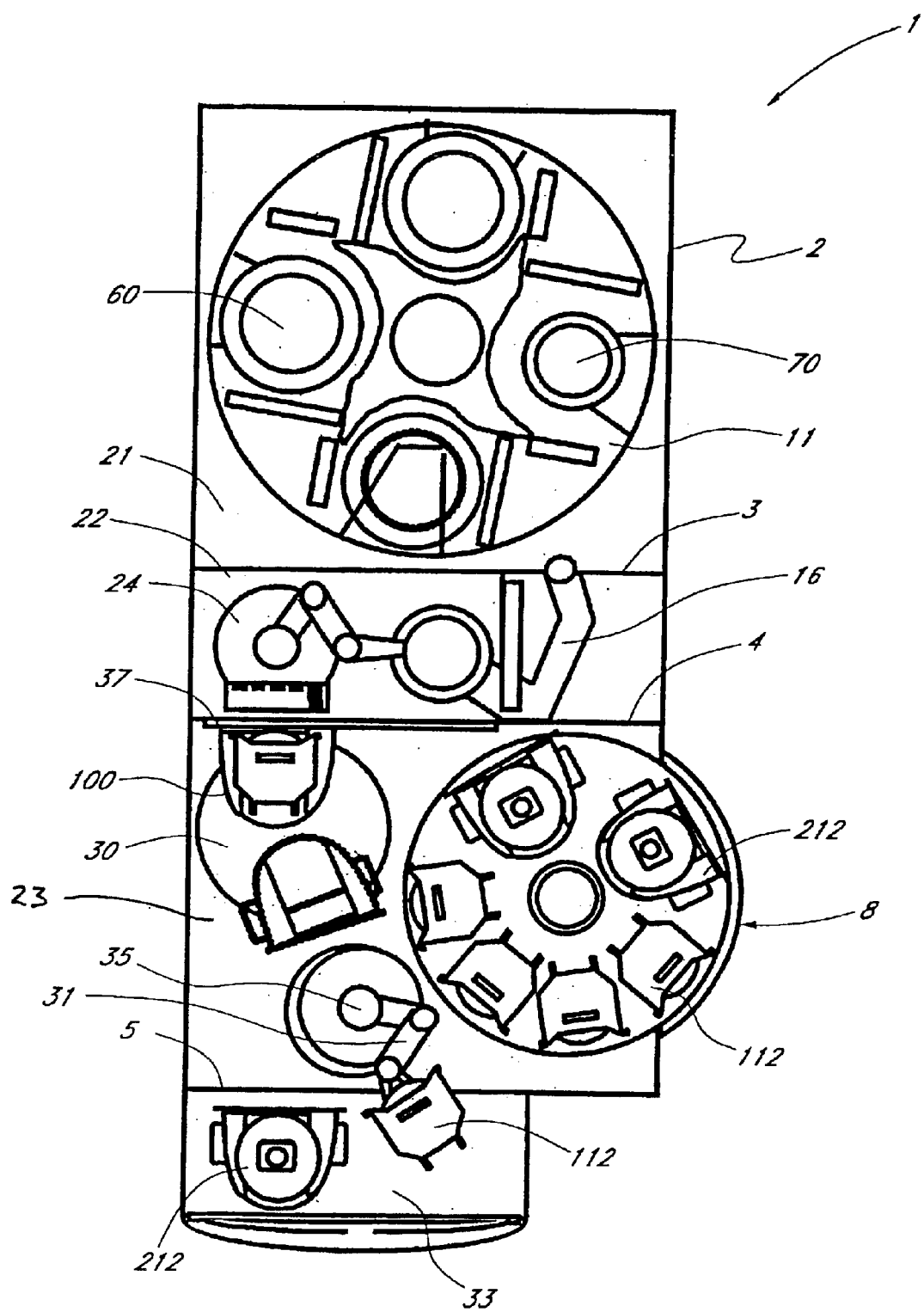
FIG. 3 is a schematic plan view of a system constructed in accordance with a preferred embodiment of the invention.

FIG. 3 shows a system according to FIGS. 1 and 2 and in addition provided with the features of the present invention. Features corresponding to those of the previously described system are referenced by similar reference numerals. The system 1 is provided with an input/output station 33 for receiving a cassette, which station is configured so that it can selectively receive a 300-mm FOUP cassette 212 or a 200-mm open cassette 112. Preferably, no mechanical adjustments are required when changing from one cassette type to the other. In the illustrated embodiment of the input/output station 33, shown in FIG. 3 and described in more detail with respect to FIGS. 7A and 7B, two input/output positions are provided in the station 33, one configured to receive a 300-mm FOUP cassette 212, and another configured to receive a 200-mm open cassette 112. In an alternative embodiment, one input/output position can be provided that is capable of selectively receiving a 300-mm FOUP cassette or a 200-mm open cassette without requiring any mechanical adjustments.

Further, the system 1 is provided with a cassette transfer region adjacent the input/output station 33. In the illustrated embodiment, the cassette transfer region is defined by the transfer chamber 23, defined by the housing 2 and partitions 4 and 5. The cassette transfer region thus includes a cassette store 8, which can be loaded with a large number of cassettes for efficient access during processing without the need for continually retrieving cassettes from and returning cassettes to the clean room environment outside the system 1.

The cassette transfer region also houses a cassette transfer mechanism. In the illustrated embodiment, the transfer mechanism includes a cassette handler 31 and a cassette transfer platform 30. The cassette handler 31 includes an elevator 35 allowing access to the multiple rotary platforms 27 of the cassette store 8, and serves to transfer cassettes among the input/output station 33, the cassette store 8 and the cassette transfer platform 30. The cassette transfer platform 30, in turn, places cassettes into active communication with the interface 37 between the cassette transfer chamber 23 and the wafer handling chamber 22, through which the wafer handling robot 24 can remove or replace wafers. In the illustrated embodiment, the cassette handler 31 transfers cassettes with the open side out, thus facilitating efficient storage on the round store 8 with narrow cassette ends facing the center of the rotary platforms 27. The cassette transfer platform 30 is therefore configured to turn cassettes received from the cassette handler 31 until the open side faces the interface 37.

Movements within the cassette transfer region are controlled by a cassette handling controller, including a central processing unit (CPU) and program therefor. In particular, the cassette handling controller instructs all movement of the cassette handler 31, rotation of the rotary platforms within the cassette store 8, rotation of the cassette transfer platform 30 and rotation of the input/output station 33. Sensors (described below) are also connected to this controller.

The cassette handler 31 of FIGS. 1 and 2 is provided with an end effector that is configured to carry the 300-mm FOUP cassettes. The preferred embodiment additionally allows the end effector 32 of the cassette handler 31 to handle a 200-mm open cassette 112. For this purpose, the preferred system 1 is provided with a cassette handler adapter 400, described in more detail below with respect to FIGS. 8–13. The cassette handler adapter is designed to be fitted on the bearing surface 32 of the cassette handler 31, to accommodate a 200-mm open cassette, and to fit into a store for this adapter plate when it is not in use.

When a 200-mm open cassette 112 is to be handled, the cassette handling controller instructs the cassette handler 31 to automatically pick up the cassette handler adapter 400 from the store and, with the cassette handler adapter 400 on the bearing surface or end effector 32 of the cassette handler 31, transfers the 200-mm cassette 112. Instead of storing the cassette handler adapter at a storing or parking location, it is also possible that the cassette handler adapter be mounted permanently on the cassette handler. As a third option, the cassette handler adapter can be slidably or rotatably mounted on the cassette handler. In this third alternative, the cassette handler adapter can, for example, be hingedly attached to the cassette handler, such that the cassette handler adapter can be flipped or otherwise adjusted between an active position for handling 200-mm open cassettes and an inactive position that allows handling of 300-mm FOUP cassettes directly upon the cassette handler.

The preferred embodiments also provide structures and methods for selectively bringing either a 300-mm FOUP or a 200-mm open cassette into active connection with the wafer handling device in such a way that the sealed environments, used in a standard 300-mm FOUP approach, remain intact. For this purpose, the system 1 is provided with a so-called "Transhipment FOUP" 100 designed to receive a 200-mm cassette 112 in its interior, as described in more detail below with respect to FIGS. 5 to 6. Unlike standard FOUPs, the Transhipment FOUP 100 is not provided with a closure. The critical outside dimensions of the Transhipment FOUP 100 are substantially identical to those of a standard FOUP.

When 200-mm wafers need to be handled, the cassette handling controller instructs the cassette handler 31 to pick up the Transhipment FOUP 100 from its storage position and places the Transhipment FOUP on the cassette transfer platform 30. Then the cassette handler 31 picks up the cassette handler adapter 400 (FIGS. 8–13) from its storage position and, equipped with the cassette handler adapter, the cassette handler 31 picks up a 200-mm cassette 112 from a storage position. The handler 31 then transports and places the 200-mm cassette 112 in the Transhipment FOUP 100 (see FIG. 17). By rotation of cassette transfer platform 30, the Transhipment FOUP 100 is placed against partition 4 and after opening of closure in the interface 37, the Transhipment FOUP 100 containing the 200-mm cassette is brought into active connection with the wafer handler 24 within the handling chamber 22. No special measures are required to allow the wafer handler 24 to handle 200-mm wafers from the 200-mm cassette. It suffices to program the wafer handler 24 with the positions of the center of the wafers and their mutual spacing, as is done for 300-mm wafer handling.

In processing chamber 21, a 300-mm wafer processing furnace is provided above position 60 and a 200-mm processing furnace is provided above position 70 of the boat transfer platform or turntable 11. The fact that in this case the processing chamber contains furnaces is not relevant to the invention. The processing area can comprise any kind of processing tool or can comprise one or more metrology tools instead of processing tools. In the latter case, the wafer processing consists of analysis of the wafer. It is also possible that processing chamber 21 is completely absent and a wafer sorting operation forms the only "treatment" that the wafers undergo. In that case the system will comprise at least two positions where a FOUP cassette can be brought in active connection with the wafer handler 24.

Figure 6:
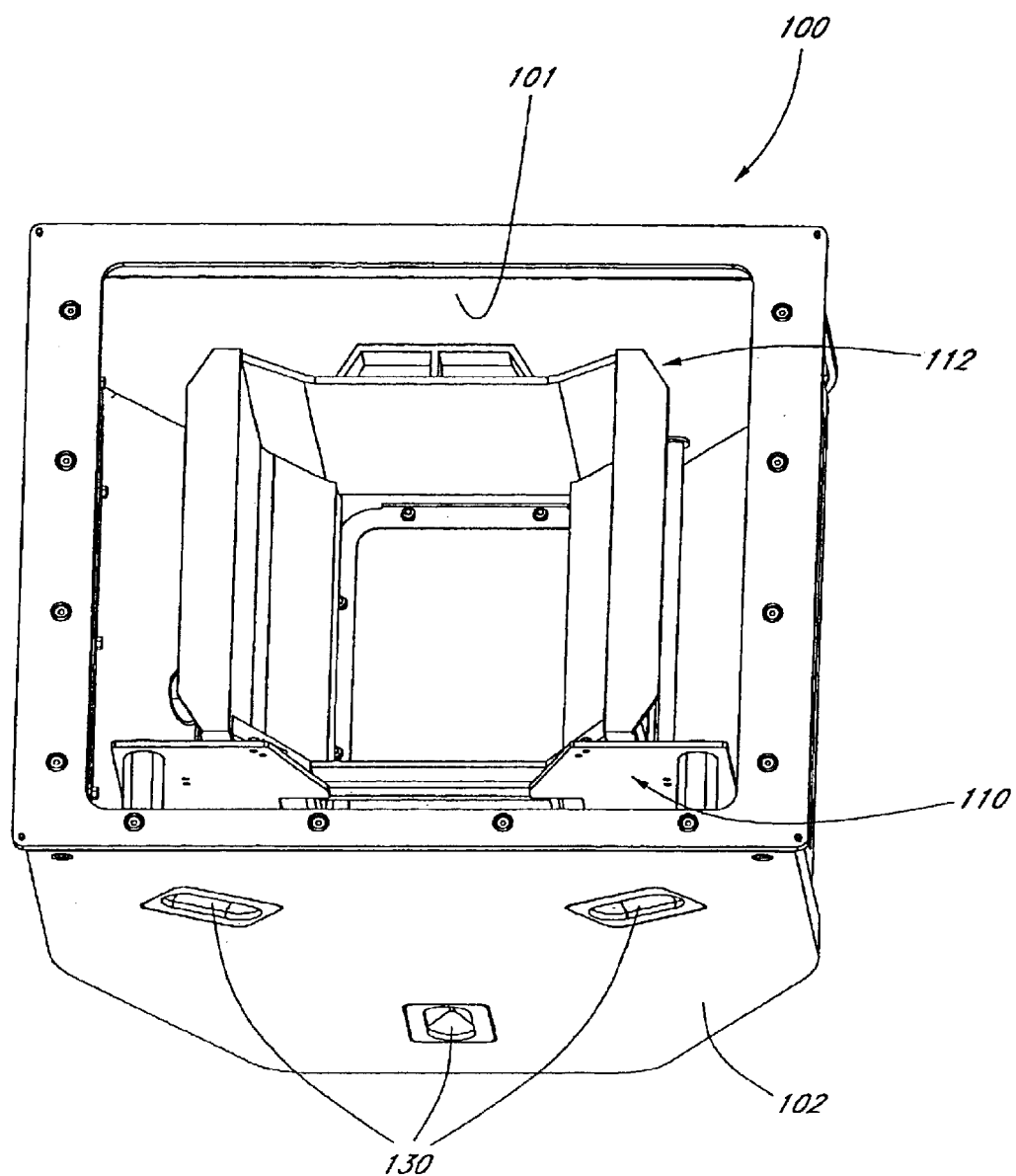
FIG. 6 is a front/bottom perspective of the Transhipment FOUP cassette of FIG. 5.
Figure 7:
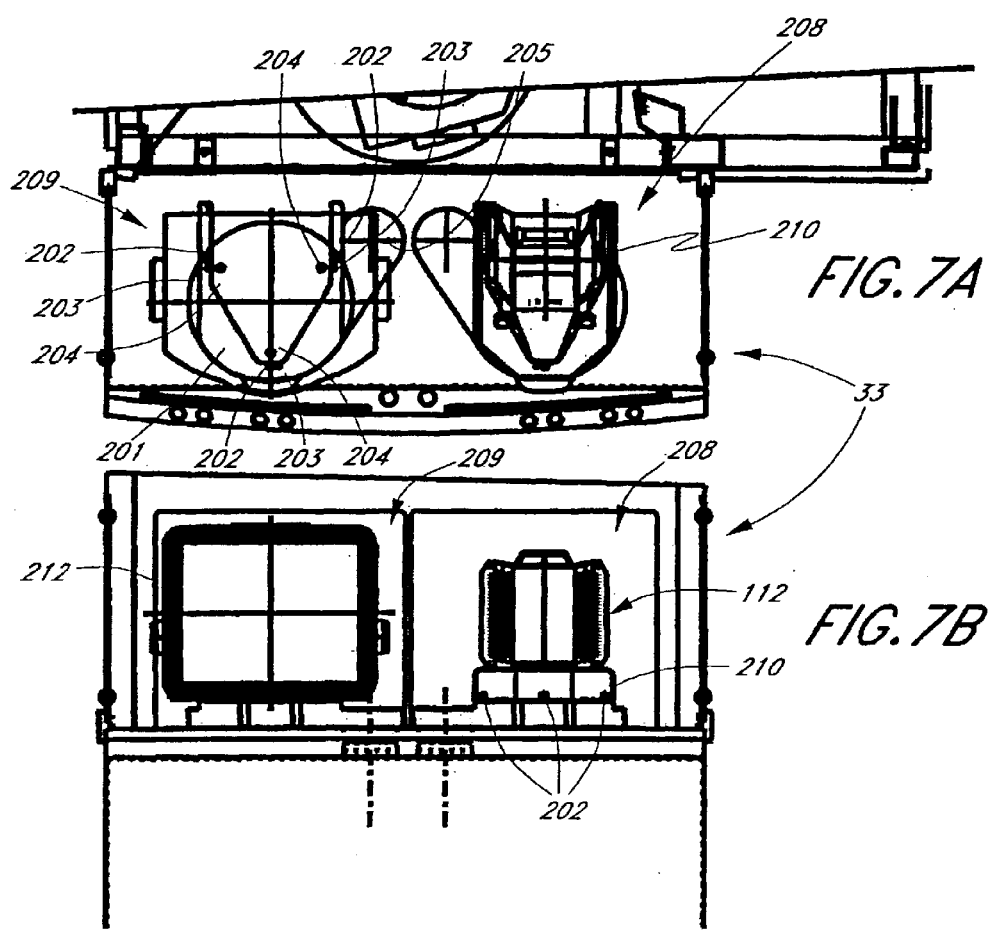
FIG. 7A is a schematic plan view of an input/output station of the system of FIG. 3.
FIG. 7B is a schematic rear elevational view of the input/output station of the system of FIG. 3.
Figure 14:
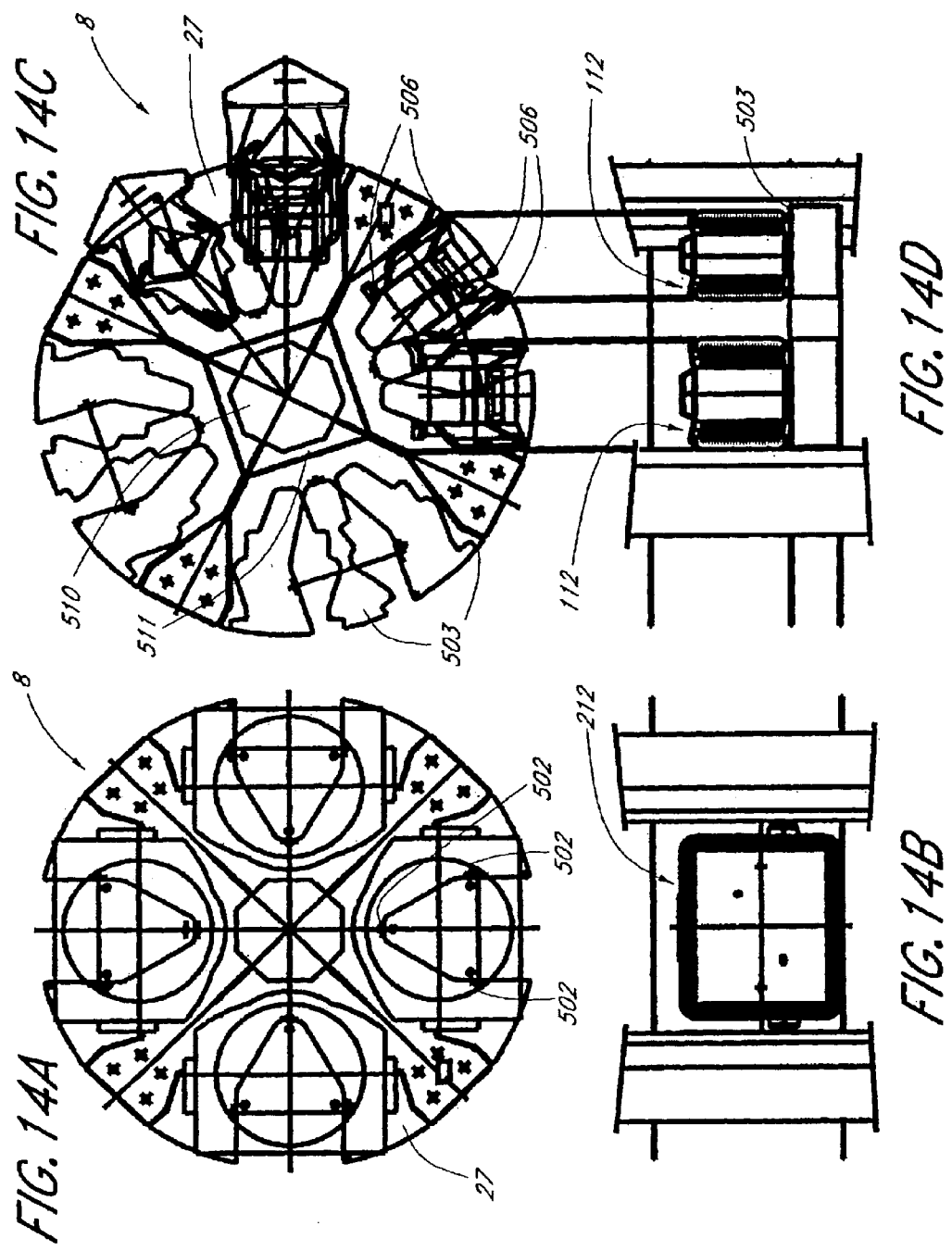
FIGS. 14A–14D are top plan and rear elevational views of a platform storing cassettes.
Figure 15:
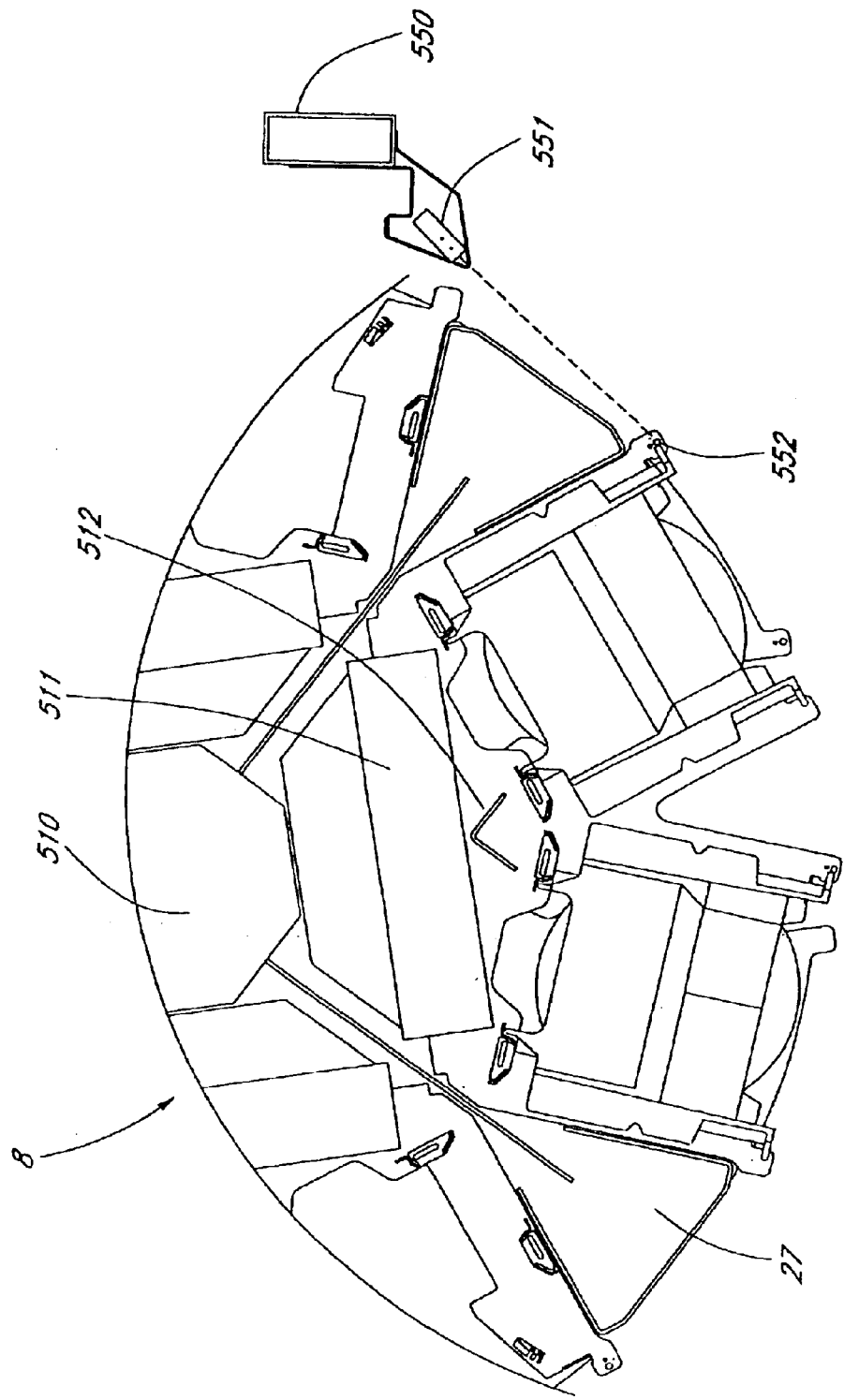
FIG. 15 is a top plan view of the platform of FIG. 14 with a cassette sensor arrangement.
Figure 16B:
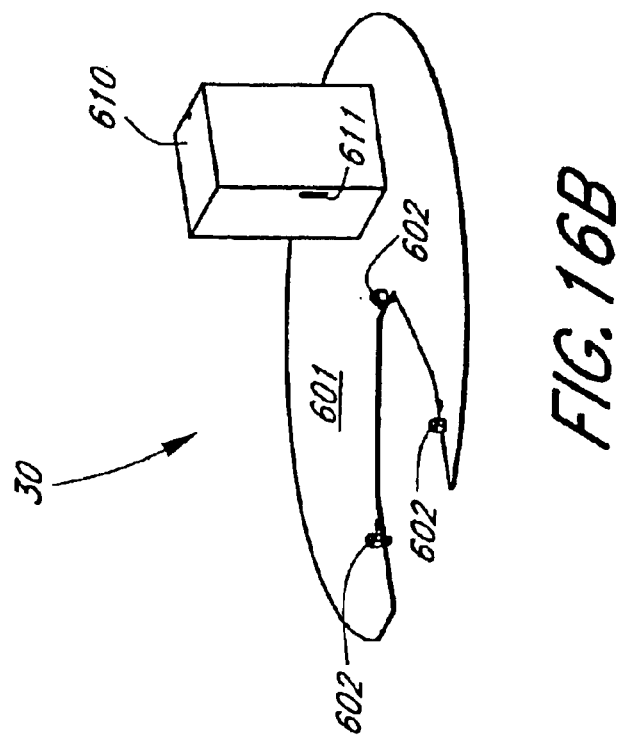
FIG. 16B is a front/right/top perspective view of the cassette transfer platform of FIG. 16A.
Figure 16A:
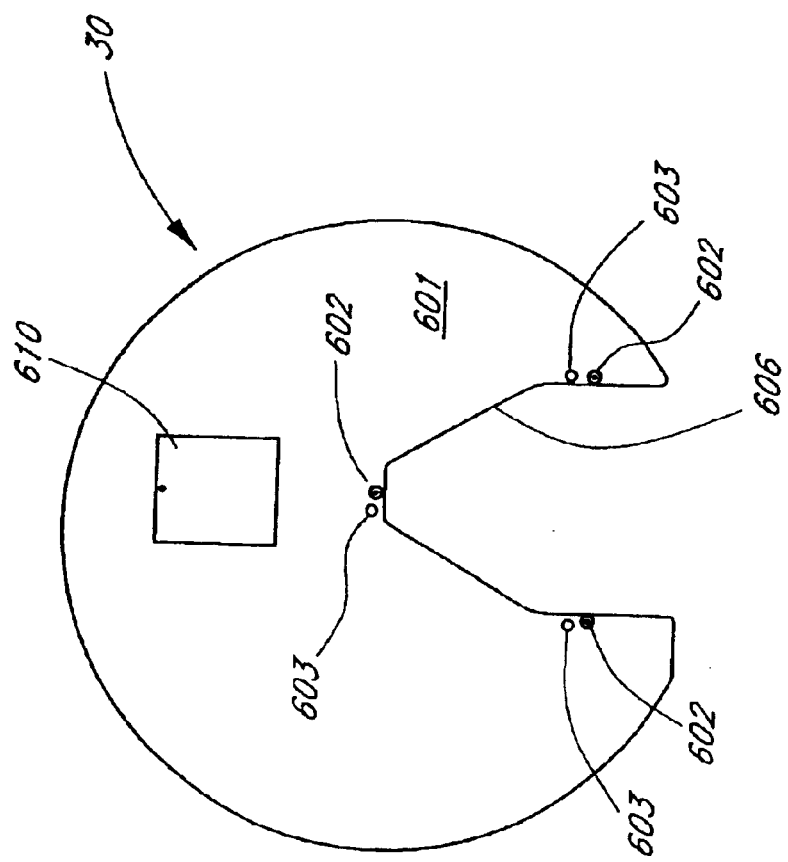
FIG. 16A is a top plan view of a cassette transfer platform, constructed in accordance with a preferred embodiment of the present invention

The invention will be explained in further detail below referring to FIGS. 4–17. The Transhipment FOUP 100 for facilitating 200-mm wafer handling in the system 1 is detailed in FIGS. 4 to 6. FIGS. 7A and 7B illustrate adaptations to the input/output station 33. FIGS. 8 to 13 illustrate the wafer handler's end effector 32, the cassette handler adapter 400 and their interaction to receive 200-mm open cassettes 112. FIGS. 14A to 15 illustrate adaptations to the store 8. FIGS. 16A and 16B illustrate adaptations to the rotatable cassette transfer platform 30. FIG. 17 illustrates placement of a 200-mm open cassette 112 within the Transhipment FOUP. Corresponding parts are indicated by like reference numerals throughout the figures.

Figure 4:
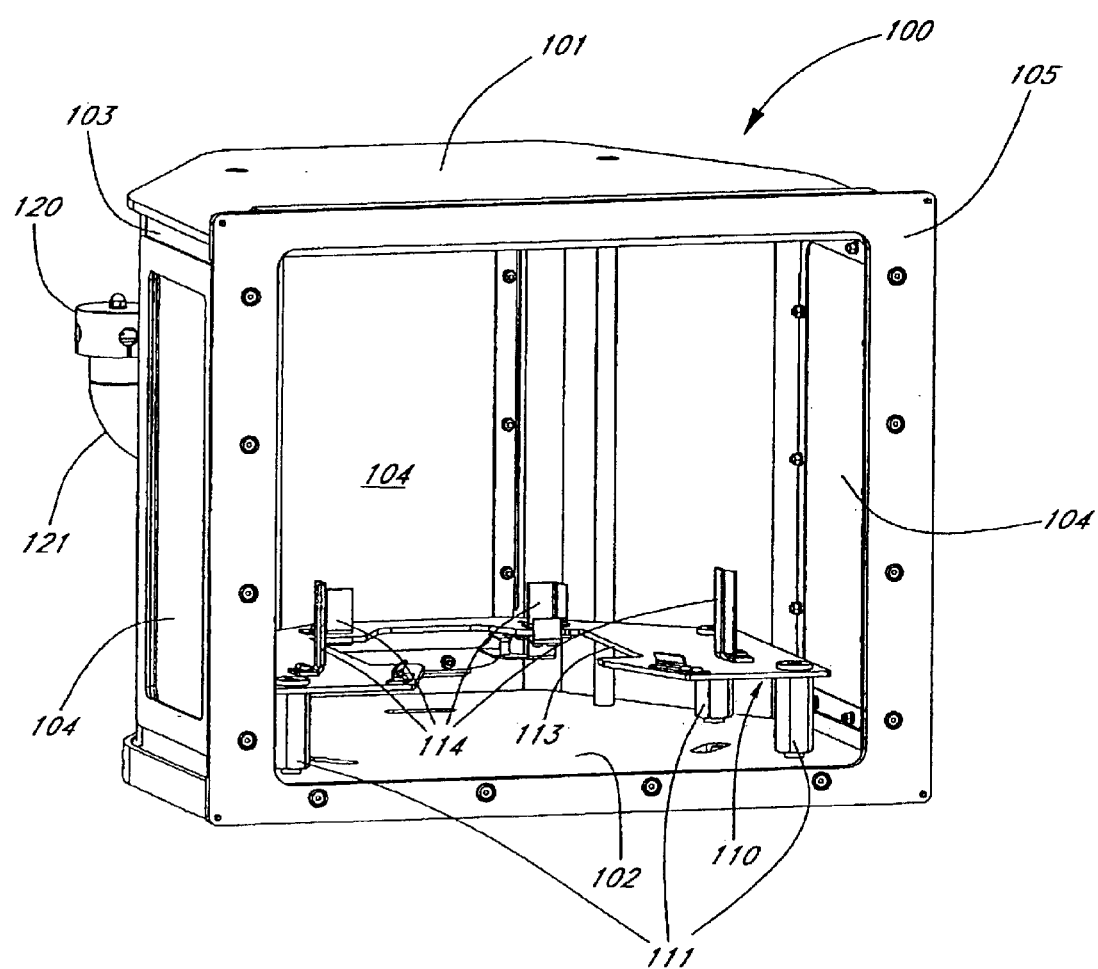
FIG. 4 is a front/left/top perspective view of a Transhipment FOUP cassette, constructed in accordance with a preferred embodiment, without an open cassette.

In FIG. 4, showing in perspective view a Transhipment FOUP without a 200-mm open cassette, the Transhipment FOUP is indicated in its entirety by 100 and comprises a top plate 101, a bottom plate 102 and sidewalls 103. The sidewalls 103 are provided with windows 104. The front side is provided with a flange surface 105, adapted to be placed sealingly against partition 4. In its interior, the Transhipment FOUP comprises a cassette receiving plate 110 to accommodate a 200-mm open cassette. The receiving plate 110 is mounted on legs 111 and is provided with cassette positioning fixtures 114 to horizontally fix the 200-mm cassette on the receiving plate 110. The bottom mechanical interface of the Transhipment FOUP is preferably identical to that of a standard 300-mm FOUP, at least in features relevant to interfacing with other elements of the system 1. Similarly, other critical outside dimensions of the Transhipment FOUP 100 fall within the dimensions of the envelope of a standard FOUP cassette.

The Transhipment FOUP is preferably also provided with a discharge pipe 121, connected to an overpressure relief valve 120 that might become active when the Transhipment FOUP 100 is in active connection with the wafer handling chamber 22 (FIG. 3). The Transhipment FOUP 100 is not provided with a closure for the open side. Despite lack of a door, because its out surfaces otherwise match those of a standard FOUP, the feature is referred to herein as a "FOUP" to distinguish the 200-mm "open" cassette.

Figure 5:
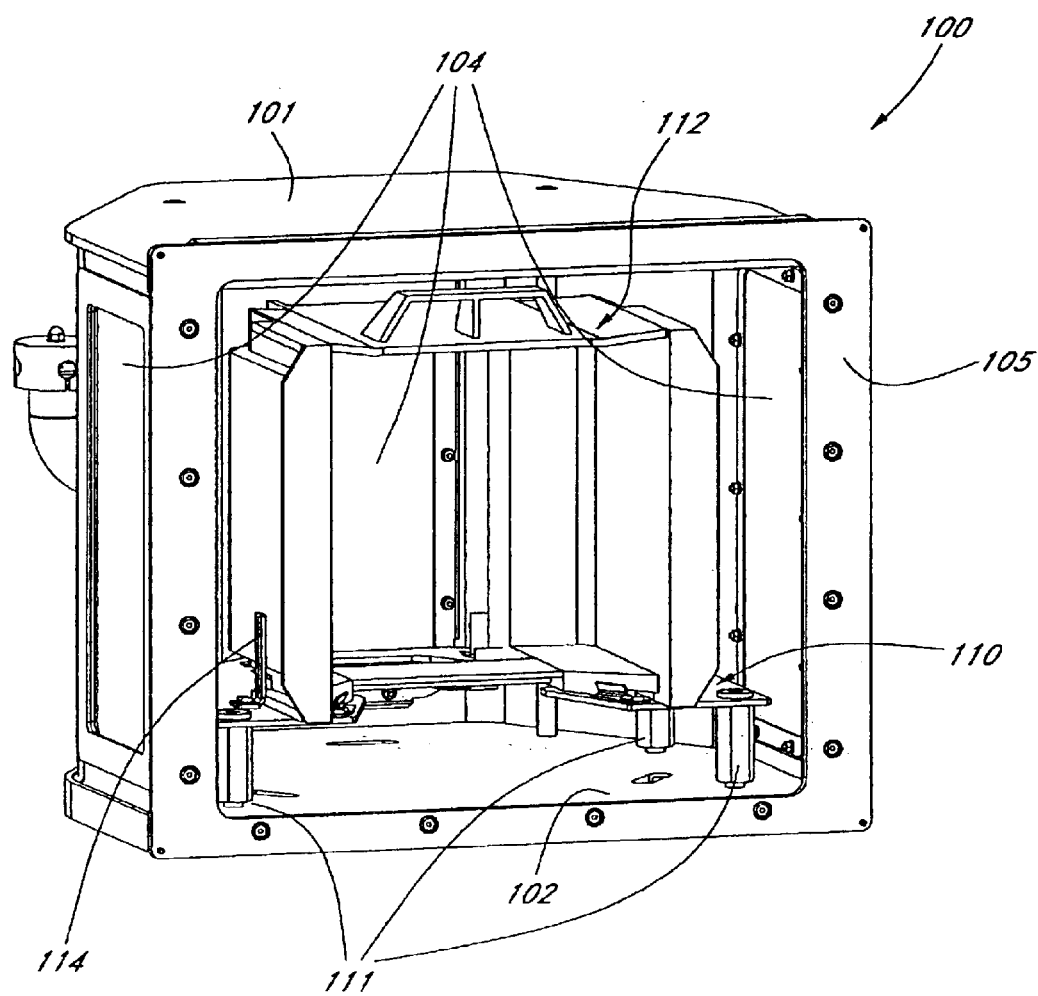
FIG. 5 is a front/left/top perspective view of the Transhipment FOUP cassette of FIG. 4, having an open cassette positioned therein.

With reference to FIG. 5, the Transhipment FOUP 100 is shown accommodating a 200-mm "open" cassette 112 on the cassette receiving plate 110. FIG. 6 shows the outer surface of the bottom 102 of the Transhipment FOUP 100 with three positioning recesses 130, intended to engage with three positioning pins, which pins are discussed below with respect to FIGS. 8, 9, 16A and 16B. The position and the dimensions of these recesses 130 and pins are standardized for handling in the semiconductor industry. The recesses 130 form elongated grooves, extending in the radial direction. The combination of the recesses 130 with the positioning pins allows the Transhipment FOUP 100 to be self-centering on the pins, similar to a standard FOUP.

With reference to FIGS. 7A and 7B, the preferred embodiment provides an input/output station 33 adapted to facilitate feeding 200-mm cassettes into the system 1 described above. FIG. 7A is a top down view and FIG. 7B is a rear view (seen from out of the system towards the input/output station 33). The input/output station 33 is provided with two cassette receiving positions 208 and 209. Receiving position 209 is configured to receive 300-mm FOUP cassettes 212 and position 208 is configured to receive 200-mm open cassettes 112.

Receiving position 209 is provided with a bearing surface 201, which can be rotated around an axis 205 to make the cassette accessible for the cassette handler 31 (FIG. 3). The bearing surface 201 is provided with three positioning pins 202, positioned and dimensioned according to SEMI STANDARD E 47.1 and the FOUP cassette is provided with matching recesses 130 (FIG. 6). Near each of these positioning pins 202, a sensor 203 is provided to detect the presence of a FOUP cassette 212. A plurality of positions 204 are also shown in FIG. 7A to indicate the points at which the positioning pins 302 of the cassette handler 31 contact a FOUP cassette 212 when lifting the cassette from the input/output station 33.

The position 208 for receiving a 200-mm open cassette is designed as a position to receive a 300-mm FOUP cassette, as described above with respect to position 209, with an additional a load port adapter frame 210 to accommodate the 200-mm open cassette. The load port adapter frame 210 is provided with a bottom mechanical interface identical to that of a 300-mm FOUP cassette so that it fits on the three positioning pins 202 of the 300-mm FOUP receiving position 209. In this way, a receiving position can easily be reconfigured to the other cassette type by either removing or placing a load port adapter frame 210 from or onto a receiving position. The load port adapter frame 210 is provided with fixtures to fix the position of the 200-mm cassette 112 and with sensors (not shown) to detect the presence of a 200-mm cassette. In an alternative embodiment, a receiving position can be designed such that either a 200-mm cassette or a 300-mm cassette can be received at the same position and sensors can detect whether and of what size a cassette is present.

Figure 8:
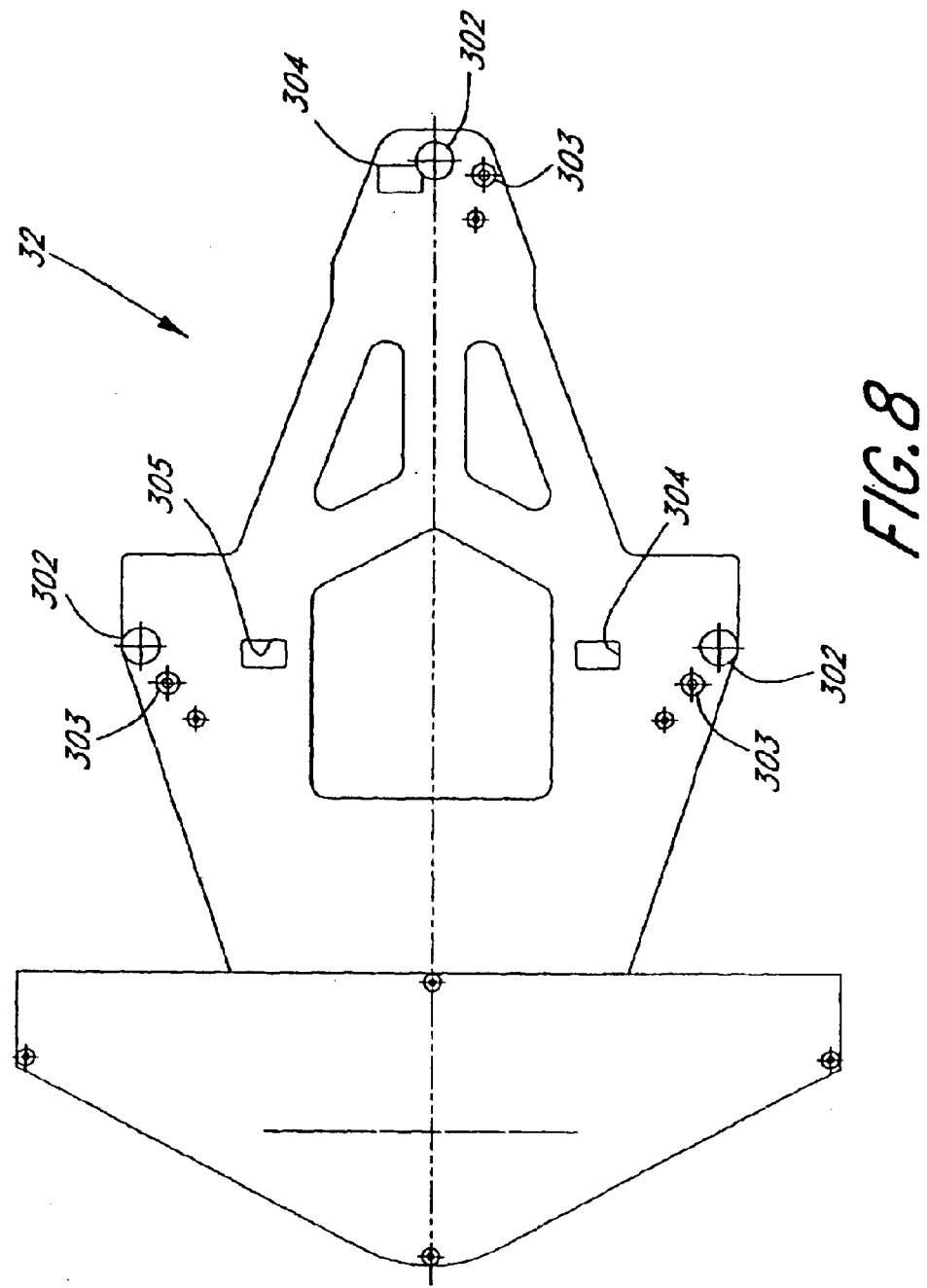
FIG. 8 is a top plan view of a cassette end effector, constructed in accordance with a preferred embodiment of the present invention.
Figure 9:
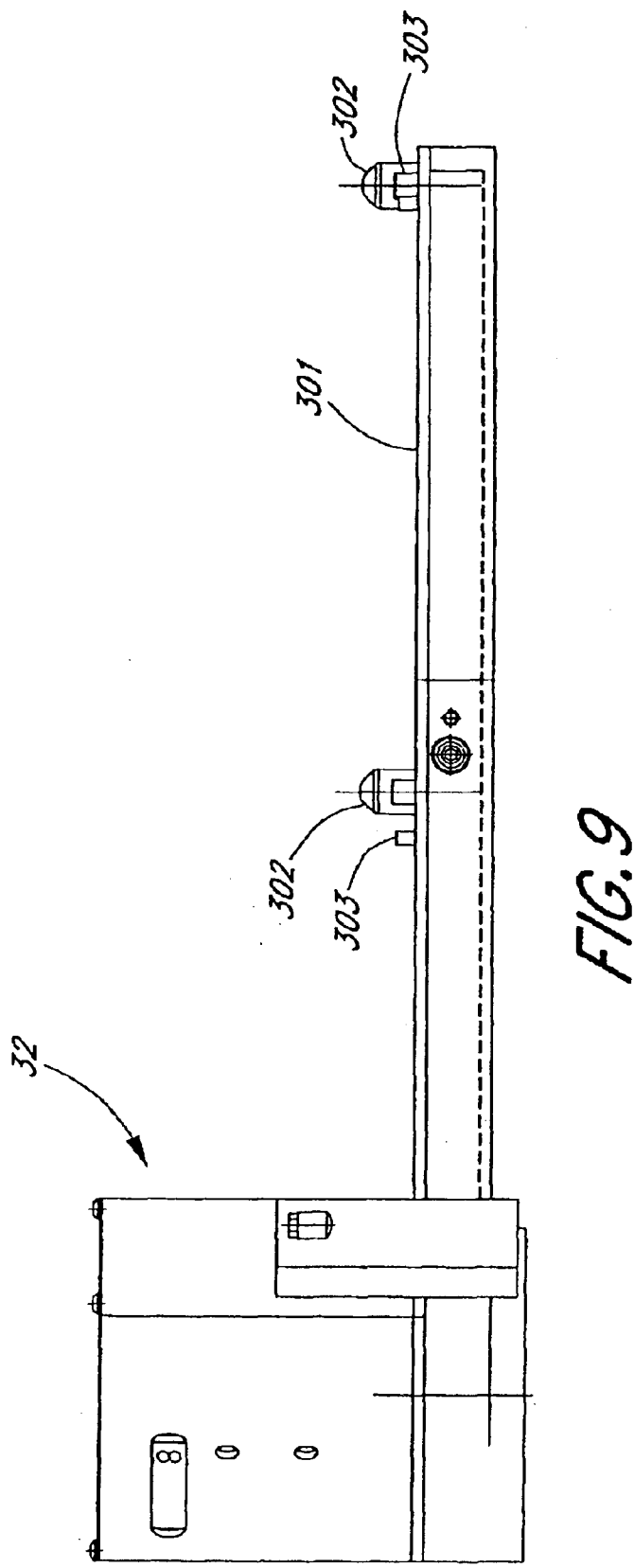
FIG. 9 is a right elevational view of the cassette end effector of FIG. 8.

With reference to FIG. 8 (top view) and FIG. 9 (side view), the end effector 32 of the cassette handler 31 is shown. The end effector is indicated in its entirety by reference numeral 32 and is provided with a bearing surface 301 to carry 300-mm FOUP cassettes. The bearing surface 301 is provided with three positioning pins 302 to pick up a FOUP cassette. The positions of the positioning pins 302 correspond to those of the positions 204 (FIGS. 7A and 7B) of the input/output station 33 and are shifted inwardly as compared to the positions of positioning pins 202 (FIGS. 7A and 7B). Both positioning pins 202 (FIGS. 7A and 7B) and 302 can be accommodated in the positioning recesses 130 in the bottom plate 102 of the FOUP cassette because these recesses 130 extend over some distance in the radial direction. In this way, the FOUP cassette can be picked up by the inner positioning pins 302 on the bearing surface 301 of the cassette handler end effector 32 while it is supported by the outer positioning pins 202 of the input/output station 33.

The end effector bearing surface 301 is provided with three sensors 303 to detect the presence of a FOUP cassette. Furthermore, the end effector bearing surface 301 is provided with a substantially rectangular hole 305 to detect the presence of a cassette handler adapter on the bearing surface 301 of the cassette handler and two substantially rectangular holes 304 for the detection of the presence of the presence of a 200-mm cassette on the cassette handler adapter, as will be explained in further detail below.

Figure 10:
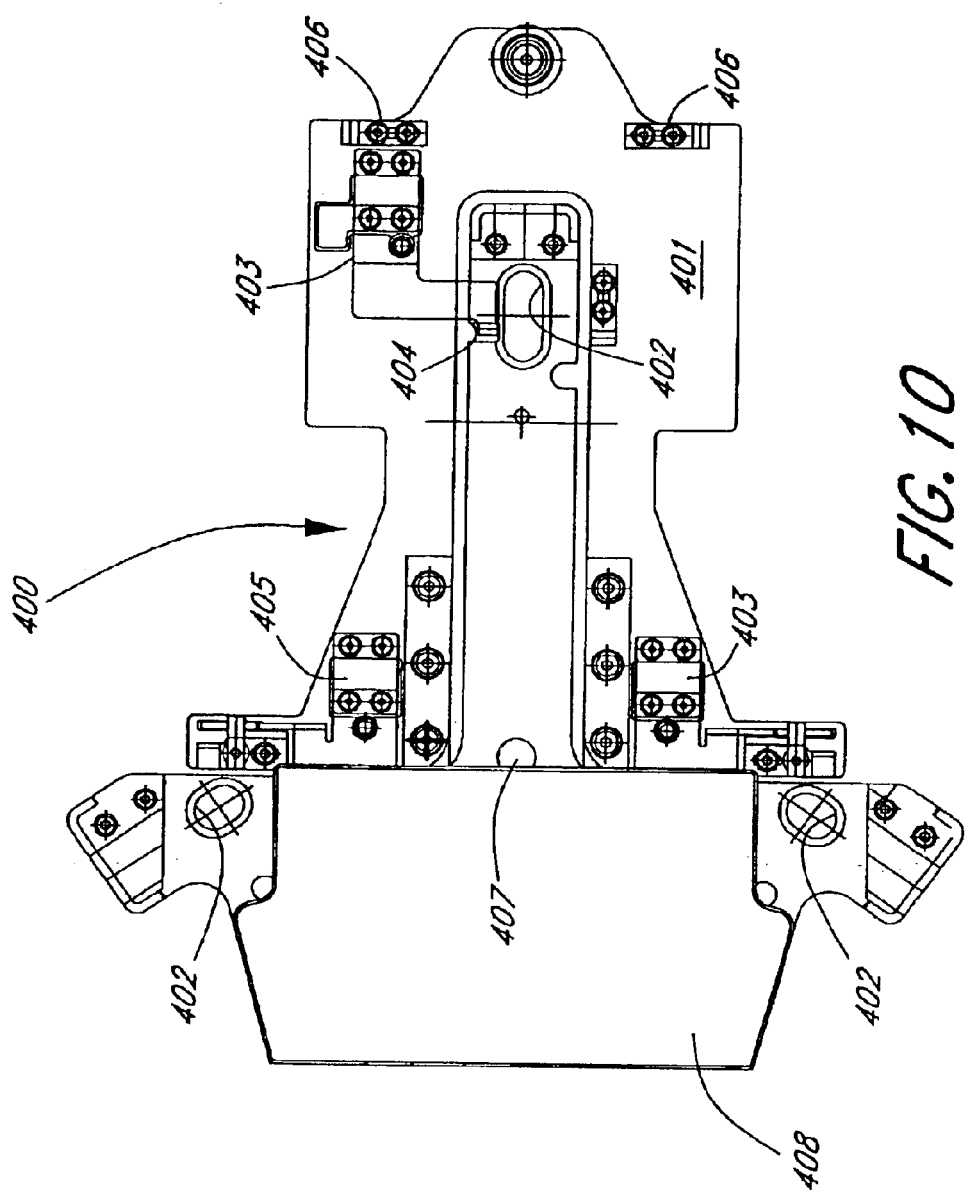
FIG. 10 is a plan top view of a cassette handler adapter, constructed in accordance with a preferred embodiment of the present invention.
Figure 11:
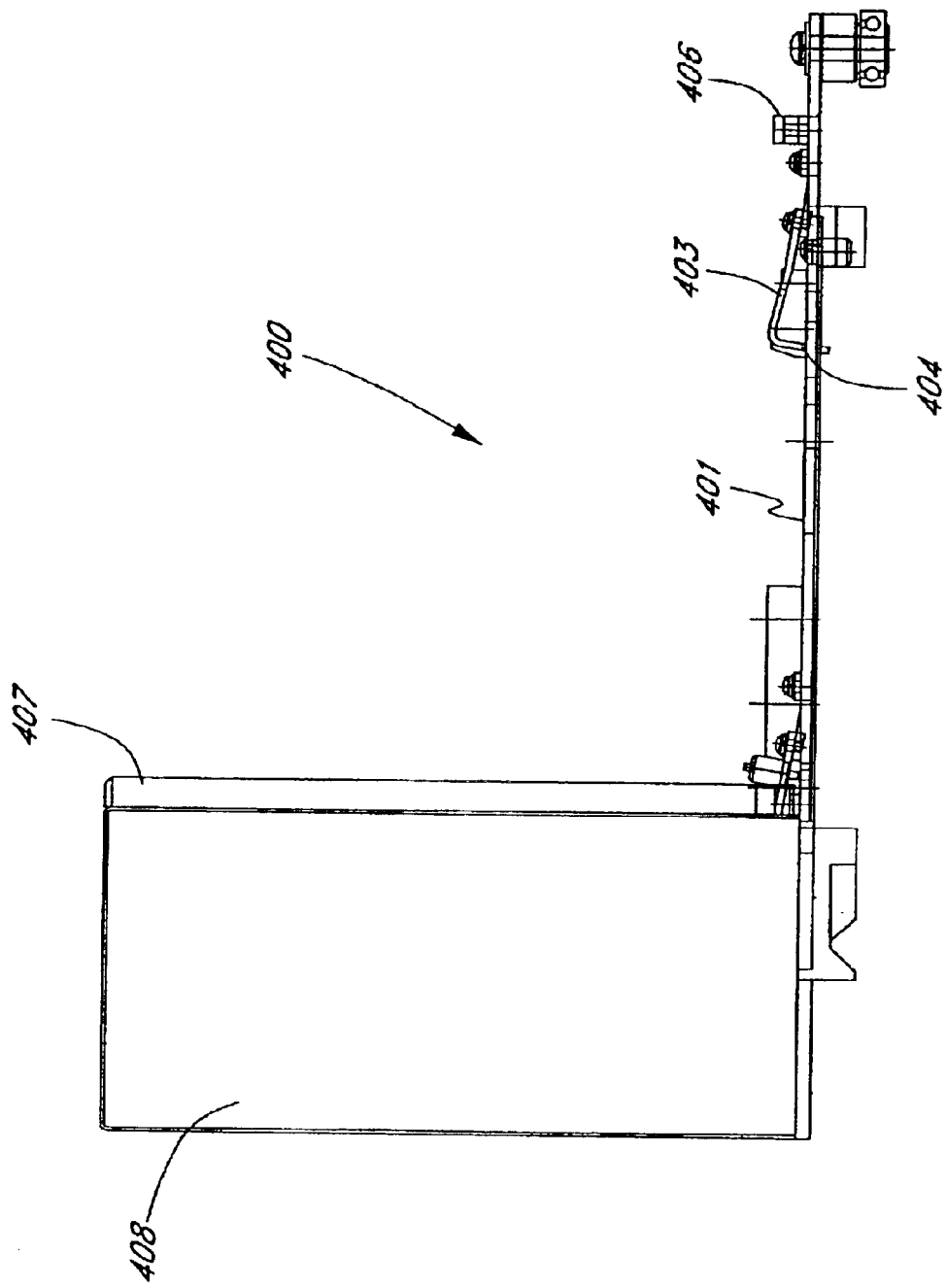
FIG. 11 is a right elevational side view of the cassette handler adapter of FIG. 10.

With reference to FIG. 10 (top view) and FIG. 11 (side view), a cassette handler adapter is provided in order to be able to handle 200-mm cassettes. The cassette handler adapter is indicated in its entirety by reference numeral 400 and is designed to be fitted on the bearing surface 301 of the cassette handler end effector 32 (FIG. 8) and to receive a 200-mm open cassette on its bearing surface 401. For this purpose the cassette handler adapter 400 is provided with three positioning holes 402 matching with the positioning pins 302 of the cassette handler end effector 32. The cassette handler adapter 400 rests by gravity on the bearing surface 301 of the cassette handler end effector 32.

When the cassette handler adapter 400 is placed on the cassette handler end effector 32, sensors 303 are activated and the presence of an object on the bearing surface is detected. However, the sensors 303 cannot discriminate between the presence of a FOUP cassette and the presence of a cassette handler adapter 400. To allow the unambiguous determination of the presence of the cassette handler adapter 400, the bearing surface 401 of the cassette handler adapter 400 is provided with a bracket 405, provided at one end with a downward pointing vane. The vane is not visible in the drawings because the cover 408 shields the position of the vane. When the cassette handler adapter 400 is placed on the bearing surface 301 of the cassette handler end effector 32, the vane sticks through the rectangular hole 305 and activates a sensor mounted adjacent to the rectangular hole 305, underneath bearing surface 301 and not shown in the drawings. In this way the presence of the cassette handler adapter 400 on the bearing surface 301 is detected.

Furthermore, the cassette handle adapter 400 is provided with two leaf springs 403, fixed at one end and provided with a vane 404 at the other end. When a 200-mm open cassette is placed on the bearing surface 401 of the cassette handler adapter 400, the upwardly pointing ends of the leaf springs 403, provided with the vanes 404, are pressed downwards through the rectangular holes 304. Adjacent to the holes 304 are mounted sensors (not shown), which detect the presence of the vanes 404 and, hence, the presence of the 200-mm open cassette.

Furthermore, the bearing surface 401 is provided with fixtures 406 to horizontally fix the 200-mm open cassette thereon. The 200-mm open cassette rests by gravity on the bearing surface 401. The cassette handler adapter 400 is also provided with a vertical bar 407 at the open side of the cassette to prevent the wafers from shifting out of the open cassette during cassette transfer. The bar is made of a material that does not damage or contaminate the wafers, like PEEK ®. A cover 408 covers one end of the cassette handler adapter 400, adjacent the vertical bar 407.

The cassette handler adapter 400, with a bottom mechanical interface identical to that of a 300-mm FOUP cassette, can be stored, when not in use, at any storage location that is designed for storage of a 300-mm FOUP cassette. This can be any compartment or storage position 9 in the store 8. In an alternative design, not shown in further detail, the cassette handler adapter can be made such that it is mounted permanently on the cassette handler, but such that it can be tilted or translated away when not is use.

Figure 12:
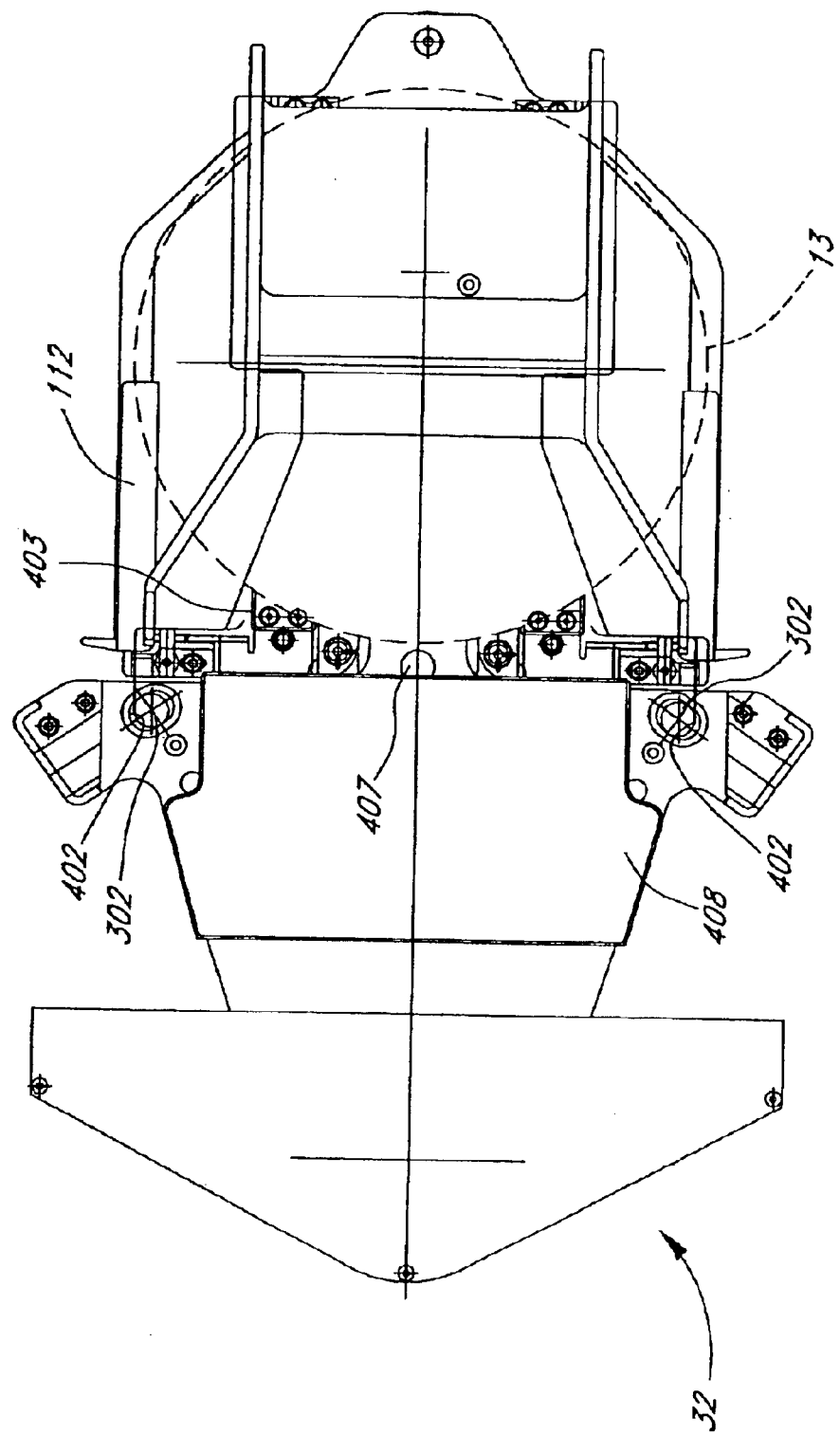
FIG. 12 is a top plan view of a cassette handler in engagement with the cassette handler adapter of FIGS. 10 and 11 and in engagement with a 200-mm cassette.
Figure 13:
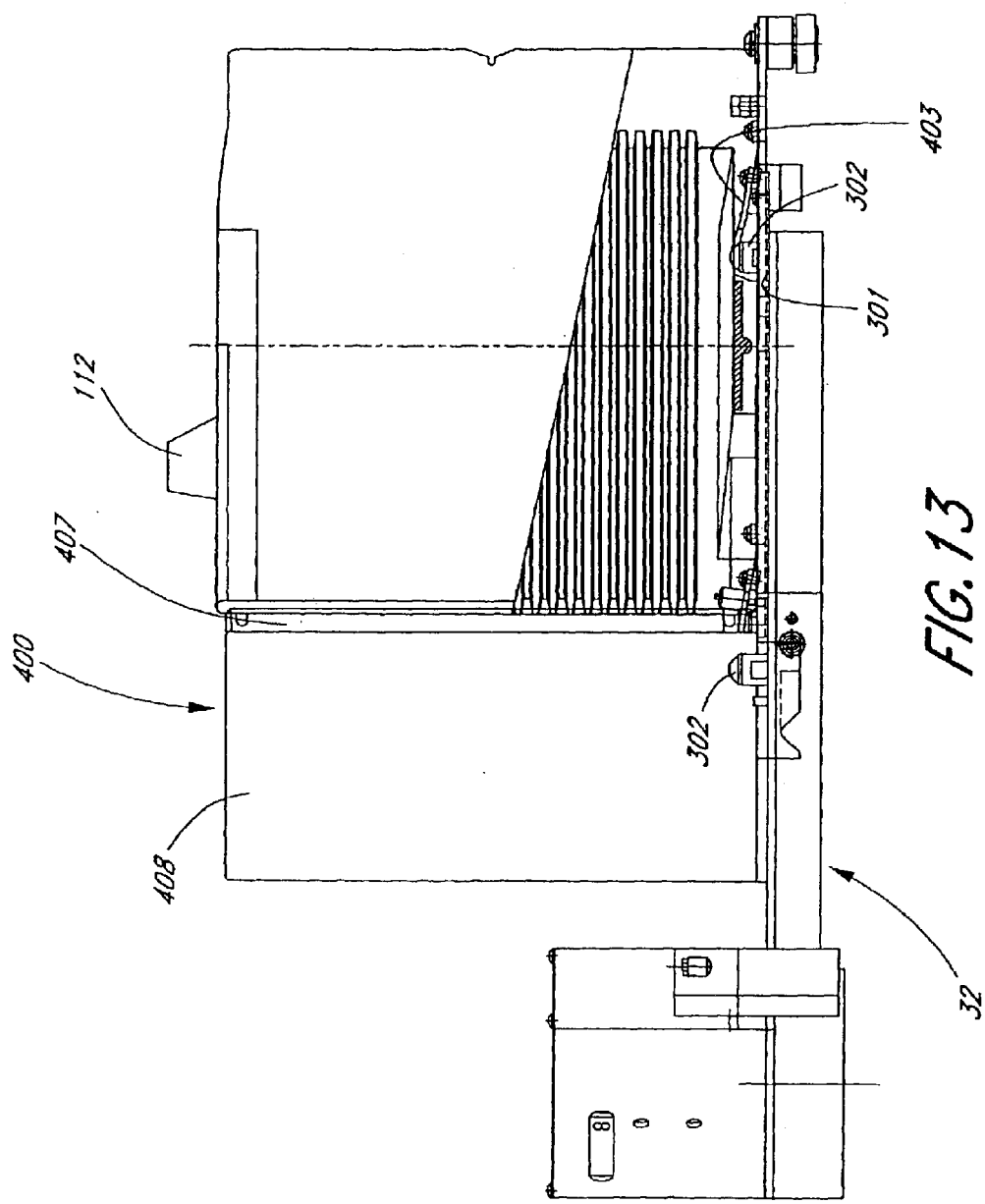
FIG. 13 is a right side elevational view of the cassette handler, cassette handler adapter, and 200-mm cassette of FIG. 12.

In FIG. 12 (top view) and FIG. 13 (side view) the cassette handler end effector 32 is shown carrying the cassette handler adapter 400 while the cassette handler adapter 400 accommodates a 200-mm open cassette 112. Features in FIGS. 12 and 13 are referenced by the same reference numerals as for corresponding parts in FIGS. 8-11. The position of a wafer 13 is indicated in the cassette 112.

In the store 8 for cassettes, a number of storage positions for 300-mm FOUP cassettes are similarly converted to 200-mm storage positions. FIGS. 14A to 14D show a platform 27 of the store 8 from a top and side views. FIGS. 14A and 14B show a platform 27 for receiving 300-mm FOUP cassettes 212. The platform 27 comprises four receiving positions, each position provided with three positioning pins 502. In the preferred embodiment, each receiving position for a 300-mm FOUP cassette can be converted to two receiving positions for 200-mm cassettes, as shown in FIGS. 14C and 14D. This can be achieved by providing a receiving position for a 300-mm FOUP cassette with a store adapter frame 503, designed to fit on the 3 positioning pins 502 and to receive two 200-mm cassettes on its upper surface. Each position to receive a 200-mm cassette is provided with fixtures 506 to horizontally fix the 200-mm cassette. The core of the rotatable store 8 is provided with a clean air supply channel 510, and filters 511, not shown in detail, can be mounted at each 200-mm compartment of the platform 27. By the use of store adapter frames 503, the number of 200-mm storage locations can simply be increased or decreased by placing or removing one or more of the store adapter frames 503.

FIG. 15 schematically shows the detection of cassettes in the cassette store 8 of FIGS. 14A–14D. Adjacent to the cassette store 8, a post 550 is mounted rigidly attached to the housing and extending in the vertical direction over the entire height of the cassette store 8. On this post 550, at each of the stacked platforms 27, optical sensors 551 are mounted to detect the presence or absence of a cassette. Inside each storage compartment, a reflector is mounted on a leaf spring. The reflector is indicated by reference numeral 552 but not shown in detail. When no cassette is present, the light beam emitted by the optical sensor 551 is reflected back by the reflector 552 mounted on the leaf spring and the sensor 551 detects the reflected light. When a cassette is present, the bottom of the cassette presses downwards the leaf spring, the reflector 552 is moved out of the light beam and the emitted light is not reflected back to the sensor 551. Consequently, the compartment is identified as being empty and available for loading a cassette only when the sensor detects a signal. The height of the sensors 551 on the post 550 with respect to the platform 27 and the direction in which the sensor is aligned are different for a 200-mm storage compartment as compared to a 300-mm storage compartment. The mounting of the post 550, of the sensors 551 on the post 550, and of the reflectors 552 relative to each other, are such that the presence of a cassette can be detected only when the cassette position on the rotary platform 27 is facing the cassette handler 31 (FIG. 3). This position, however, is the most relevant situation for detection. Although the system keeps track of where the cassettes in the system are, the sensors provide an extra check and safety in order to prevent, for example, attempts to place a cassette in a position where a cassette is already present. With this sensing strategy, each cassette position of the rotatable cassette storage platform 27 does not require an individual sensor 551. This avoids the need for electrical wiring being routed via a rotation feedthrough to a controller, which would increase the complexity of the system significantly. FIG. 15 shows also in greater detail the clean air supply channel 510 and the air filter 511 for a 200-mm compartment. Furthermore, an air guiding strip 512, extending over substantially the entire height of the filter, is provided to guide the air in the direction of the respective centers of the 200-mm cassettes.

FIGS. 16A and 16B show the rotatable cassette transfer platform 30 from top down and perspective views, respectively. The rotatable cassette transfer platform 30 has a bearing surface 601. The bearing surface 601 is provided with a cutout 606 to allow vertical passage of the end effector 32 of the cassette handler 31. Three positioning pins 602 are positioned and sized to mate with the recesses 130 (FIG. 6) in the bottom of a FOUP cassette and sensors 603 detect the presence of a FOUP cassette. Three sensors 603 are shown in FIG. 16A. It will be clear that this provides a high degree of redundancy and safety and that a reduced number of sensors can also be used. The sensors 603 are not shown in FIG. 16B. Opposite the open side of the cutout 606, a sensor housing 610 is mounted on the bearing surface 601. At the side facing the FOUP cassette, the sensor housing is provided with an opening 611 to pass a detection beam from and to a sensor, which mounted inside the sensor housing and not shown in the figures. When an empty Transhipment FOUP is placed on the bearing surface 601, the sensors 603 detect its presence. However, the sensors 603 cannot discriminate between the presence of a standard FOUP and the Transhipment FOUP 100. For this purpose the sensor inside sensor housing 610 is provided. The detection works similar to the detection of the presence of a cassette in the cassette store 8, as described above. When a normal FOUP cassette is placed on the cassette transfer platform 30, the light emitted by the sensor within the sensor housing 610 and passing through hole 611 will only be scattered diffusely, rather than reflected backwards in the direction of the sensor. Consequently, the sensor will not deliver a signal.

On the other hand, in case of a Transhipment FOUP 100 (FIGS. 4–6) the sensor will deliver a signal in the following way: The cassette receiving plate 110 in the Transhipment FOUP 100 is provided with a reflector mounted on a leaf spring and properly positioned. When an empty Transhipment FOUP 100 is placed on the cassette transfer platform 30, the light emitted by the sensor in the sensor housing 610, passing through hole 611 and the window 104 in wall 103 of the Transhipment FOUP that faces the sensor housing, hits the reflector. The reflector reflects the light back in the direction of the sensor and the sensor within the sensor housing 610 will detect the reflected light. The sensors are connected to the controller. When sensors 603 and the sensor inside the sensor housing 610 are simultaneously activated, the presence of the Transhipment FOUP 100 on the platform 30 is unambiguously detected. When a 200-mm open cassette is subsequently placed on the cassette receiving plate 110 of the Transhipment FOUP, the leaf spring is pressed downwards and the reflector, mounted on the leaf spring, is moved out of the beam and the sensor does not detect a signal anymore. By this sequence of events the presence of a 200-mm cassette 112 inside the Transhipment FOUP 100 is detected. As can be seen from FIG. 16A, the position of the cassette on the platform 30 is somewhat asymmetrical.

As noted above, movements within the cassette transfer region are controlled by a cassette handling controller, comprising a central processing unit (CPU) and associated programming. The controller communicates with the sensors described above and is programmed to have the cassette handler 31 automatically pick up (or otherwise install) the cassette handler adapter 400 when needed and to automatically store the cassette handler adapter 400 when not needed. Similarly, the cassette handling controller is programmed such that, when 200-mm wafers need to be handled from a 200-mm cassette, the cassette handler 31 automatically picks up the Transhipment FOUP 100 and places it on the cassette transfer platform 30 if not already there (as determined by sensor communications with the controller), and the handler 31 picks up the 200-mm open cassette and places it in the Transhipment FOUP 100. The "need" for handling 200-mm open cassettes and the wafers stored therein can be pre-programmed or can be instructed by a user at the control panel 36 (see FIG. 1).

In operation, when one or more 200-mm open cassettes 112 need to be introduced into the system 1 the procedure is as follows: a 200-mm cassette 112 is placed on the 200-mm position 208 of the receiving station 33. When the system 1 is instructed to handle the 200-mm cassette 112, the cassette handler controller is programmed such that before handling the 200-mm cassette 112, the cassette handler 31 automatically picks up the cassette handler adapter 400 from its storage position. Then the cassette handler 31, equipped with the cassette handler adapter 400, transfers the 200-mm cassette 112 from the receiving position 208 at the input/output station 33 to a 200-mm storage position in the cassette store 8. Sequentially, more than one 200-mm cassette can be introduced according to the need of the moment.

When 200-mm wafers need to be loaded into a boat 12, the cassette handler controller instructs the cassette handler 31 to transfer the Transhipment FOUP 100 from its storage position in the store 8 to the cassette transfer platform 30. Then, the cassette handler 31 picks up the cassette handler adapter 400 from its storage position and, equipped with the cassette handler adapter 400, retrieves a 200-mm cassette 112 (typically from the store 8) and places it on the cassette receiving plate 110 in the interior of the Transhipment FOUP 100. Then the cassette transfer platform 30 rotates the Transhipment FOUP 100 and places it against partition 4. After opening the closure of the interface 37 in partition 4, the wafer handler 24 can transfer 200-mm wafers from the 200-mm open cassette 112 to a 200-mm wafer boat within the wafer handling chamber 22 for processing the wafers. The system is programmed such that it will load wafers only in a wafer boat corresponding with the size of the wafers to be loaded and the wafer boat will only be loaded into a furnace or other tool corresponding to the boat size (see FIG. 3). When transfer of the 200-mm wafers out of the cassette 112 is complete, the cassette handling controller instructs the cassette transfer platform to rotate the Transhipment FOUP 100 away from the interface 37 and the cassette handler 31 removes the 200-mm open cassette 112 from the Transhipment FOUP 100, to make room for another cassette.

The procedure of placing a 200-mm cassette inside a 300-mm Transhipment FOUP is illustrated in FIG. 17. The cassette handler 31, equipped with the cassette handler adapter 400, and bearing a 200-mm cassette 112, moves into the Transhipment FOUP 100 at the appropriate height. When the cassette handler 31 has reached the correct distance into the Transhipment FOUP 100, the cassette handler 31 moves downwardly through the cut-out 113 (see FIG. 4) of the cassette receiving plate 110 till the 200-mm cassette 112 is placed on the cassette receiving plate 110. Then the cassette handler 31 moves downward an incremental distance to release the 200-mm cassette 112 onto the plate 110 and the cassette handler 31 retracts from the Transhipment FOUP 100.

To someone skilled in the art, it will be clear that the invention can be embodied in other ways. It is possible to replace the rotatable store by a bookshelf store wherein the compartments are arranged side-by-side according to a rectangular grid. Then the cassette handler requires corresponding degrees of freedom in movement to be able to reach all the compartments. It is also possible that the cassette handler brings the cassette in active connection with the wafer handler, with the use of a stationary platform instead of the rotatable platform according to the present embodiment.

The skilled artisan will similarly appreciate that many other omissions, additions and modifications to the preferred embodiment can be made without departing from the spirit and scope of the present invention. It is accordingly desired that the present embodiment be considered in all respects as illustrative and not restrictive, reference being made to the appended claims rather than to the foregoing description to indicate the scope of the invention.

We claim:

1. A wafer processing system configured for handling standard 300-mm FOUP cassettes, the system comprising:
   an input/output station;
   a cassette transfer region adjacent to the input/output station;
   a wafer handling chamber adjacent to the cassette transfer region, the wafer handling chamber senarated from the cassette transfer region by an interface configured for interacting with a 300-mm FOUP cassette;
   a cassette transfer mechanism configured for transferring cassettes from the input/output station through the cassette transfer region to the interface;
   a wafer handling robot within the wafer handling chamber, the wafer handling robot configured to access wafers within cassettes through the interface; and
   a tool set adapted for receiving and transferring 200-mm open cassettes within the wafer processing system, wherein the cassette transfer mechanism comprises a cassette handler robot configured to transfer cassettes between the input/output station and the cassette transfer region, wherein the cassette handler robot has a bearing surface designed to receive a standard 300-mm FOUP cassette, the wafer processing system further comprising a cassette handler adapter configured to fit on the bearing surface, the cassette handler adapter further configured to accommodate a 200-mm open cassette thereon.

2. The wafer processing system of claim 1, wherein the interface comprises a partition between the cassette transfer region and the wafer handling chamber, the partition having a closable opening therein mating with a 300-mm FOUP cassette.

3. The wafer processing system of claim 1, wherein the tool set comprises a Transhipment FOUP cassette having external surfaces conforming to a 300-mm FOUP cassette standard, the Transhipment FOUP cassette comprising an internal platform configured to receive a 200-mm open cassette.

4. The wafer processing system of claim 3, further comprising a storage position within the cassette transfer region to store the Transhipment FOUP cassette when not in use.

5. The wafer processing system of claim 3, further comprising a sensor arrangement to determine presence of a 200-mm cassette at discrete positions within the wafer processing system, the sensor arrangement capable of distinguishing presence of a 300-mm FOUP cassette from presence of a 200-mm open cassette at the discrete locations.

6. The wafer processing system of claim 5, wherein the sensor arrangement is capable of distinguishing presence of a standard 300-mm FOUP cassette from presence of the Transhipment FOUP cassette at a discrete location.

7. The wafer processing system of claim 5, wherein the sensor arrangement includes a plurality of light sensors, light emitters, reflectors and a central processing unit.

8. The wafer processing system of claim 1, wherein the cassette transfer mechanism further comprises a cassette transfer platform configured to receive cassettes from the cassette handler robot and place cassettes into an active position accessible by the wafer transfer robot through the interface.

9. The wafer processing system of claim 8, wherein the cassette transfer platform comprises a turntable.

10. The wafer processing system of claim 1, further comprising a storage position to store the cassette handler adapter when not in use.

11. The wafer processing system of claim 10, wherein the storage position is on the cassette handler robot.

12. The wafer processing system of claim 10, further comprising a cassette store accessible to the cassette handler robot, the storage position for storing the cassette handler adapter comprising a designated position within the cassette store.

13. The wafer processing system of claim 1, further comprising a cassette store within the cassette transfer region, the cassette store accessible to the cassette handler robot, the cassette store comprising a storage platform having a plurality of 300-mm FOUP store positions.

14. The wafer processing system of claim 13, wherein the store comprises a plurality of stacked rotary storage platforms, each platform divided into a plurality of storage compartments and defining the 300-mm FOUP store positions.

15. A wafer processing system configured for handling standard 300-mm FOUP cassettes, the system comprising:
   an input/output station;
   a cassette transfer region adjacent to the input/output station;
   a wafer handling chamber adjacent to the cassette transfer region, the wafer handling chamber separated from the cassette transfer region by an interface configured for interacting with a 300-mm FOUP cassette;
   a cassette transfer mechanism configured for transferring cassettes from the input/output station through the cassette transfer region to the interface;
   a wafer handling robot within the wafer handling chamber, the wafer handling robot configured to access wafers within cassettes through the interface; and
   a tool set adapted for receiving and transferring 200-mm open cassettes within the wafer processing system, wherein the cassette transfer mechanism comprises a cassette handler robot configured to transfer cassettes between the input/output station and the cassette transfer region, further comprising a cassette store within the cassette transfer region, the cassette store accessible to the cassette handler robot, the cassette store comprising a storage platform having a plurality of 300-mm FOUP store positions, wherein the tool set comprises a store accommodation plate, configured to fit on one of the 300-mm FOUP store positions, the store accommodation plate configured to accommodate at least one 200-mm open cassette.

16. The wafer processing system of claim 15, wherein the store accommodation plate is configured to accommodate two 200-mm open cassettes.

17. A wafer processing system configured for handling standard 300-mm FOUP cassettes, the system comprising:
   an input/output station;
   a cassette transfer region adjacent to the input/output station;
   a wafer handling chamber adjacent to the cassette transfer region, the wafer handling chamber separated from the cassette transfer region by an interface configured for interacting with a 300-mm FOUP cassette;
   a cassette transfer mechanism configured for transferring cassettes from the input/output station through the cassette transfer region to the interface;
   a wafer handling robot within the wafer handling chamber, the wafer handling robot configured to access wafers within cassettes through the interface; and
   a tool set adapted for receiving and transferring 200-mm open cassettes within the wafer processing system, wherein the tool set comprises a load port adapter plate configured to fit on a position of the input/output station designed to receive a standard 300-mm FOUP cassette, the load port adapter plate configured to accommodate a 200-mm open cassette thereon.

18. A wafer processing system configured for handling standard 300-mm FOUP cassettes, the system comprising:
   an input/output station;
   a cassette transfer region adjacent to the input/output station;
   a wafer handling chamber adjacent to the cassette transfer region, the wafer handling chamber separated from the cassette transfer region by an interface configured for interacting with a 300-mm FOUP cassette;
   a cassette transfer mechanism configured for transferring cassettes from the input/output station through the cassette transfer region to the interface;
   a wafer handling robot within the wafer handling chamber, the wafer handling robot configured to access wafers within cassettes through the interface; and
   a tool set adapted for receiving and transferring 200-mm open cassettes within the wafer processing system, wherein the cassette transfer mechanism comprises a cassette handler robot configured to transfer cassettes between the input/output station and the cassette transfer region, wherein the tool set comprises a Transhipment FOUP cassette having external surfaces conforming to a 300-mm FOUP cassette standard, the Transhipment FOUP cassette comprising an internal platform configured to receive a 200-mm open cassette, further comprising a sensor arrangement to determine presence of a 200-mm cassette at discrete positions within the wafer processing system, the sensor arrangement capable of distinguishing presence of a 300-mm FOUP cassette from presence of a 200-mm open cassette at the discrete locations, wherein the sensor arrangement includes a plurality of light sensors, light emitters, reflectors and a central processing unit, wherein the cassette handler robot includes an end effector with a bearing surface configured to receive a standard 300-mm FOUP cassette, the wafer processing system further comprising a cassette handler adapter configured to fit on the bearing surface of the cassette handler robot, the cassette handler adapter further configured to accommodate a 200-mm open cassette thereon, wherein the sensor arrangement comprises at least one light sensor and one light emitter arranged to detect the cassette handler adapter when mounted upon the bearing surface of the cassette handler robot.

19. The wafer processing system of claim 18, wherein the sensors communicate with the central processing unit and the central processing unit is provided with a program instructing the cassette handler robot to automatically pick up the cassette handler adapter when needed for transferring a 200-mm open cassette, the program further instructing the cassette handler robot to store the cassette handler adapter when not needed for transferring a 200-mm open cassette.

20. The wafer processing system of claim 18, wherein the sensors communicate with the central processing unit and the central processing unit is provided with a program instructing the cassette handler robot to automatically place a 200-mm open cassette inside the Transhipment FOUP when wafers need to be transferred from the 200-mm open cassette to the wafer transfer robot or vice versa, the program further instructing the cassette handler robot to remove the 200-mm open cassette when transfer of wafers between the 200-mm open cassette and the wafer handler robot is complete.

21. The wafer processing system of claim 18, wherein
   the bearing surface of the cassette handler robot has at least one sensor hole,
   the cassette handler adapter includes a depending vane aligned with the sensor hole when the cassette handler adapter is mounted upon the bearing surface of the cassette handler robot, and
   the sensor arrangement includes a sensor for detecting the vane extending downwardly through the sensor hole when the cassette handler adapter is mounted upon the bearing surface of the cassette handler robot.

* * * * *

UNITED STATES PATENT AND TRADEMARK OFFICE
CERTIFICATE OF CORRECTION

| | | |
|---|---|---|
| PATENT NO. | : 6,981,832 B2 | Page 1 of 1 |
| APPLICATION NO. | : 10/641807 | |
| DATED | : January 3, 2006 | |
| INVENTOR(S) | : Jan Zinger and Christianus G. M. De Ridder | |

It is certified that error appears in the above-identified patent and that said Letters Patent is hereby corrected as shown below:

Title page, Column 2 (Foreign Patent Documents), line 2, after "7/1999" insert --H01L/21/00--.

Column 12, line 39, in Claim 1, delete "senerated" and insert --separated-- therefor.

Signed and Sealed this

Eighteenth Day of July, 2006

JON W. DUDAS
*Director of the United States Patent and Trademark Office*